(12) United States Patent
Wang

(10) Patent No.: US 12,022,628 B2
(45) Date of Patent: Jun. 25, 2024

(54) DISPLAY DEVICE

(71) Applicant: BOE TECHNOLOGY GROUP CO., LTD., Beijing (CN)

(72) Inventor: Xinyu Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 392 days.

(21) Appl. No.: 17/627,269

(22) PCT Filed: Dec. 15, 2020

(86) PCT No.: PCT/CN2020/136535
§ 371 (c)(1),
(2) Date: Jan. 14, 2022

(87) PCT Pub. No.: WO2022/126376
PCT Pub. Date: Jun. 23, 2022

(65) Prior Publication Data
US 2022/0400562 A1 Dec. 15, 2022

(51) Int. Cl.
*G06F 1/16* (2006.01)
*H05K 5/00* (2006.01)
*H05K 5/02* (2006.01)
*H05K 7/00* (2006.01)

(52) U.S. Cl.
CPC ........ *H05K 5/0217* (2013.01); *H05K 5/0018* (2022.08)

(58) Field of Classification Search
CPC ... H05K 5/0217; H05K 5/0018; G06F 1/1652
See application file for complete search history.

(56) References Cited

U.S. PATENT DOCUMENTS

| 2012/0050075 | A1* | 3/2012 | Salmon | G06F 1/1626 |
| | | | | 361/679.01 |
| 2018/0020556 | A1 | 1/2018 | Seo et al. | |
| 2019/0098776 | A1 | 3/2019 | Jeon | |
| 2019/0297736 | A1 | 9/2019 | Xu et al. | |
| 2021/0169242 | A1* | 6/2021 | Luo | A47G 5/02 |
| 2021/0368637 | A1* | 11/2021 | Suga | H05K 5/0017 |
| 2023/0028213 | A1* | 1/2023 | Yang | H04M 1/0268 |

FOREIGN PATENT DOCUMENTS

| CN | 107464501 A | 12/2017 |
| CN | 107622734 A | 1/2018 |
| CN | 108230937 A | 6/2018 |
| CN | 110360431 A | 10/2019 |
| CN | 111653202 A | 9/2020 |

* cited by examiner

Primary Examiner — Anthony M Haughton
(74) Attorney, Agent, or Firm — IP & T GROUP LLP

(57) ABSTRACT

A display device includes a display screen, connection members and a driving apparatus. The display screen includes a flexible display panel and a plurality of supports. The plurality of supports include a first support and a second support that are adjacently arranged. The first support includes a connection portion. A connection member in the connection members is disposed on the second support. The driving apparatus is configured such that the driving apparatus drives the connection member to be connected to or disconnected from the connection portion.

19 Claims, 14 Drawing Sheets

DISPLAY DEVICE

CROSS-REFERENCE TO RELATED APPLICATION

This application is a national phase entry under 35 USC 371 of International Patent Application No. PCT/CN 2020/136535 filed on Dec. 15, 2020, which is incorporated herein by reference in its entirety.

TECHNICAL FIELD

The present disclosure relates to the field of display technologies, and in particular, to a display device.

BACKGROUND

In recent years, the development of flexible display technologies has greatly promoted the development of future display technologies toward portability and diversification. A rollable flexible display device is capable of saving space to a great extent due to a flexible display screen that can be rolled and stored, which is convenient for a user to carry, and becomes one of hot spots in the development of future display technologies.

SUMMARY

Some embodiments of the present disclosure provide a display device. The display device includes a housing, a reel, a display screen, connection members and a driving apparatus. An opening is disposed in the housing. The reel is rotatably disposed in the housing. A first end of the display screen is connected to the reel. The display screen includes a flexible display panel and a plurality of supports arranged in a length direction of the flexible display panel. Any two adjacent supports in the plurality of supports are a first support and a second support in sequence in the length direction. The first support includes a connection portion and a first surface, and the second support includes a second surface. The first surface and the second surface are configured to support the flexible display panel. A connection member in the connection members is disposed on the second support. The driving apparatus is configured such that when the first surface and the second surface are coplanar, the driving apparatus drives the connection member to move relative to the second support between a first position and a second position. When the connection member is at the first position, the connection member is connected to the connection portion, so that the second support and the first support are connected. When the connection member is at the second position, the connection member is disconnected from the connection portion, so that the display screen is able to be wound on the reel.

In some embodiments, the driving apparatus includes a rack and pinions. The rack is fixedly disposed at the opening, and an extending direction of the rack is parallel to the length direction of the flexible display panel. A pinion in the pinions is rotatably disposed on the second support, and is fixedly connected to the connection member. The pinion is configured such that when the first surface and the second surface are coplanar, and the display screen extends out or retracts relative to the housing through the opening, the pinion is engaged with the rack to drive the connection member to rotate between the first position and the second position.

In some embodiments, in a width direction of the flexible display panel, an accommodation space is disposed at an end of the second support. The second support further includes a third surface arranged opposite to the second surface. The accommodation space is located between the third surface and the second surface, and penetrates through two ends of the second support in the length direction of the flexible display panel. The pinion and the connection member are disposed in the accommodation space, and the rack is configured such that the rack extends into the accommodation space to be engaged with the pinion.

In some embodiments, the connection portion is a clamping groove disposed in a side surface of the first support proximate to the second support. The accommodation space and the clamping groove are configured such that when the first surface and the second surface are coplanar, the clamping groove and the accommodation space are arranged opposite to each other, so that the connection member is able to cooperatively extend into the clamping groove from the accommodation space to make the connection member at the first position.

In some embodiments, the accommodation space includes an accommodation groove disposed in a side surface of the second support proximate to the first support and a limiting groove disposed in an end surface of the second support in the width direction of the flexible display panel. The limiting groove penetrates through the two ends of the second support in the length direction of the flexible display panel. The accommodation groove has a communication port communicated with the limiting groove, and the pinion is disposed at the communication port. The rack is configured such that the rack extends into the limiting groove to be engaged with the pinion. At least one portion of the connection member is located in the accommodation groove. The accommodation groove and the clamping groove are configured such that when the first surface and the second surface are coplanar, the clamping groove and the accommodation groove are arranged opposite to each other, so that the connection member is able to cooperatively extend into the clamping groove from the accommodation groove.

In some embodiments, the accommodation groove and the clamping groove are configured such that when the first surface and the second surface are coplanar, the accommodation groove and the clamping groove are matched to form a fan-shaped groove. The fan-shaped groove includes a first groove wall on the first support, a second groove wall on the second support, and an arc-shaped groove wall connected between the first groove wall and the second groove wall. The communication port is disposed at a position closer to an apex of the fan-shaped groove than the arc-shaped groove wall. The connection member is configured such that when at the first position, the connection member abuts against the first groove wall, and when at the second position, the connection member is located in the accommodation groove, and abuts against the second groove wall.

In some embodiments, the display device further includes first elastic limiting members and second elastic limiting members. At least one portion of a first elastic limiting member in the first elastic limiting members is located in the clamping groove. The first elastic limiting member is configured such that when the connection member is at the first position, the first elastic limiting member abuts against the connection member to prevent the connection member from rotating to the second position, and when the connection member rotates between the first position and the second position, the first elastic limiting member is deformed under an extrusion of the connection member to avoid a movement track of the connection member. At least one portion of a second elastic limiting member in the second elastic limiting members is located in the accommodation space. The second elastic limiting member is configured such that when the connection member is at the second position, the second elastic limiting member abuts against the connection member to prevent the connection member from rotating to the first position, and when the connection member rotates between the first position and the second position, the second elastic limiting member is deformed under the extrusion of the connection member to avoid the movement track of the connection member.

In some embodiments, the connection member is rod-shaped, an end of the connection member is fixedly connected to the pinion, and another end of the connection member is an abutting portion. The first elastic limiting member is configured such that when the connection member is at the first position, the first elastic limiting member abuts against the abutting portion to prevent the connection member from rotating to the second position. The second elastic limiting member is configured such that when the connection member is at the second position, the second elastic limiting member abuts against the abutting portion to prevent the connection member from rotating to the first position.

In some embodiments, the abutting portion includes a first cylindrical surface and two first rounded surfaces. A generatrix of the first cylindrical surface is perpendicular to a central axis of the pinion. The two first rounded surfaces are respectively located at two end edges of the first cylindrical surface in a rotation direction of the connection member. The first elastic limiting member is configured such that when the connection member is at the first position, the first elastic limiting member abuts against a first rounded surface in the two first rounded surfaces proximate to the second support. The second elastic limiting member is configured such that when the connection member is at the second position, the second elastic limiting member abuts against another first rounded surface in the two first rounded surfaces proximate to the first support.

In some embodiments, the abutting portion includes a second cylindrical surface, and a generatrix of the second cylindrical surface is parallel to a central axis of the pinion. The first elastic limiting member is configured such that when the connection member is at the first position, the first elastic limiting member abuts against a side of the second cylindrical surface proximate to the second support. The second elastic limiting member is configured such that when the connection member is at the second position, the second elastic limiting member abuts against a side of the second cylindrical surface proximate to the first support.

In some embodiments, the abutting portion includes a third cylindrical surface and two second rounded surfaces. A central axis of the third cylindrical surface coincides with a central axis of the pinion. The two second rounded surfaces are respectively located at two end edges of the third cylindrical surface in a rotation direction of the connection member. The first elastic limiting member is configured such that when the connection member is at the first position, the first elastic limiting member abuts against a second rounded surface in the two second rounded surfaces proximate to the second support. The second elastic limiting member is configured such that when the connection member is at the second position, the second elastic limiting member abuts against another second rounded surface in the two second rounded surfaces proximate to the first support.

In some embodiments, the first elastic limiting member includes a first circular arc surface configured to abut against the abutting portion. The second elastic limiting member includes a second circular arc surface configured to abut against the abutting portion.

In some embodiments, in a cross-section of the reel, a distance from a tail-end of a contour line of the reel to a rotation center of the reel is greater than a distance from a head-end of the contour line to the rotation center of the reel. The first end of the display screen is connected to the head-end of the contour line, and the display screen is configured to be wound on the reel in a direction from the head-end to the tail-end of the contour line.

In some embodiments, the contour line includes a plurality of linear segments connected in sequence. In a winding direction of the display screen on the reel, distances from the plurality of linear segments to the rotation center of the reel are gradually increased.

In some embodiments, the distance from the tail-end of the contour line to the rotation center of the reel is d1, the distance from the head-end to the rotation center of the reel is d2, and a thickness of the display screen is m, where d1 and d2 satisfy d1−d2=m.

In some embodiments, the display device further includes a driving spring. The driving spring is spirally arranged around the reel, an end of the driving spring is connected to the reel, and another end of the driving spring is connected to the housing. The driving spring is configured such that when the reel rotates in a first rotation direction, the driving spring is wound up to apply a reset force to the reel that is able to drive the reel to rotate in a second rotation direction. The first rotation direction is a rotation direction of the reel when the display screen extends out of the housing through the opening, and the second rotation direction is an opposite direction to the first rotation direction.

In some embodiments, the display device further includes a ratchet, an operating shaft and a pawl. The ratchet is fixedly sleeved on the reel, and includes a plurality of ratchet teeth. Each ratchet tooth includes a tooth back surface and a stop surface arranged in sequence in the second rotation direction. A distance from an end of the tooth back surface proximate to the stop surface to a center of the ratchet is greater than a distance from an end of the tooth back surface away from the stop surface to the center of the ratchet. The operating shaft is rotatably disposed on the housing, and a portion of the operating shaft extends out of the housing. The pawl is fixed on the operating shaft, and extends into a tooth groove between two adjacent ratchet teeth.

In some embodiments, the second support includes a third rounded surface disposed on a side of the second surface proximate to the first support. The first support includes a fourth rounded surface disposed on a side of the first surface proximate to the second support.

In some embodiments, the display device further includes a limiting member with a mounting groove, and the mounting groove is matched with a second end of the display screen to fix the limiting member on the display screen. In a thickness direction of a portion of the display screen extending out the housing, a dimension of the limiting member is greater than a dimension of the opening.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal involved in the embodiments of the present disclosure.

DETAILED DESCRIPTION

Figure 1:
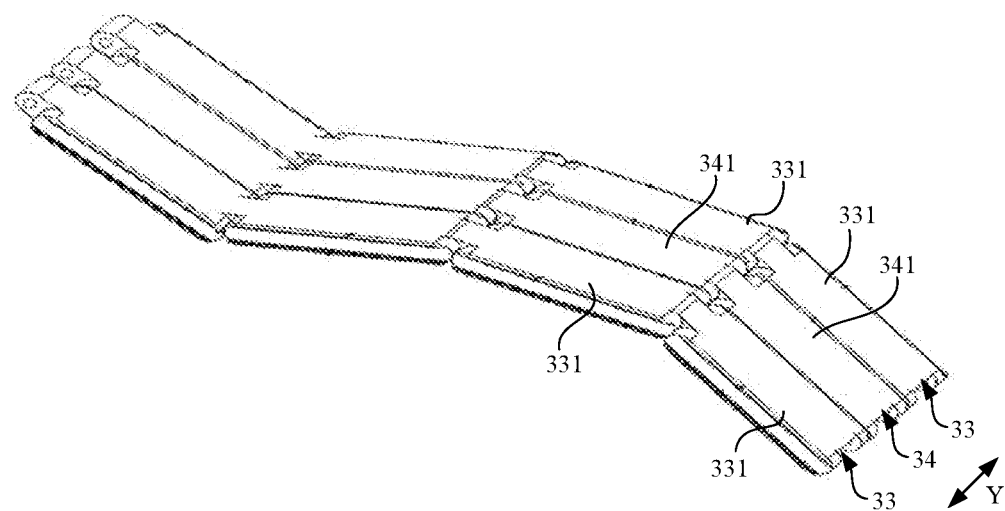
FIG. 1 is a schematic structural diagram of a support apparatus in a first state in the related art.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "an example", "specific example" or "some examples" are intended to indicate that specific features, structures, materials or characteristics related to the embodiment(s) or example(s) are included in at least one embodiment or example of the present disclosure.

Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first" and "second" are only used for descriptive purposes, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and its derivative expressions may be used. For example, the term "connected" may be used in the description of some embodiments to indicate that two or more components are in direct physical contact or electrical contact with each other.

The phrase "at least one of A, B and C" has a same meaning as the phrase "at least one of A, B or C", both including the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" as used herein indicates an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

Exemplary embodiments are described herein with reference to sectional views and/or plan views as idealized exemplary drawings. In the accompanying drawings, thicknesses of layers and regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. Therefore, the regions shown in the accompanying drawings are schematic in nature, and their shapes are not intended to show actual shapes of the regions in a device, and are not intended to limit the scope of the exemplary embodiments.

At present, in some rollable display devices, a flexible display panel and a support apparatus for supporting the flexible display panel are directly wound on a reel to achieve storage. Although it is convenient for storage by directly winding the flexible display panel on the reel, when the flexible display panel is used, since the support apparatus is not easy to maintain a straight state after being rolled and then unfolded, the flexible display panel is easy to deform with the support apparatus, thereby affecting user experience in use.

Figure 2:
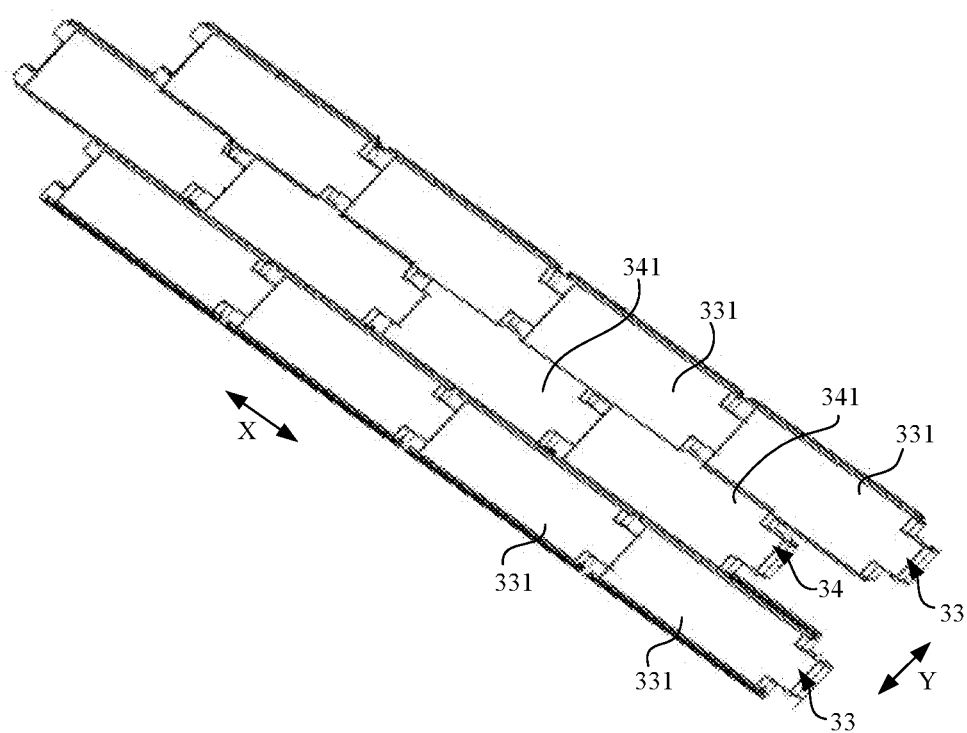
FIG. 2 is a schematic structural diagram of a support apparatus in a second state in the related art.

In order to solve the problem that the flexible display panel deforms with the support apparatus, a support apparatus for supporting a flexible display panel is provided in the related art, as shown in FIGS. 1 and 2. FIG. 1 is a schematic structural diagram of the support apparatus in a first state, and FIG. 2 is a schematic structural diagram of the support apparatus in a second state.

The support apparatus includes fixed support groups 33 and a sliding support group 34. The fixed support group 33 includes a plurality of fixed supports 331 hinged in sequence and arranged in a length direction X of the flexible display panel. The sliding support group 34 includes a plurality of sliding supports 341 hinged in sequence and arranged in the length direction X of the flexible display panel.

The fixed support groups 33 and the sliding support group 34 are arranged in a width direction Y of the flexible display panel. The sliding support group 34 is slidable relative to the fixed support groups 33 in the length direction X of the flexible display panel, so as to switch the support apparatus between the first state and the second state.

As shown in FIG. 1, when the support apparatus is in the first state, the sliding supports 341 in the sliding support group 34 are aligned with the fixed supports 331 in the fixed support group 33, so that the support apparatus may be wound on the reel with the flexible display panel.

As shown in FIG. 2, when the support apparatus is in the second state, the sliding supports 341 in the sliding support group 34 are staggered with the fixed supports 331 in the fixed support group 33 to prevent the support apparatus from bending, so that the support apparatus is able to maintain a straight state to better support the flexible display panel, thereby avoiding the flexible display panel from being deformed during use.

However, when the support apparatus is switched between the first state and the second state, the sliding support group 34 is required to move relative to the flexible display panel in the length direction X of the flexible display panel, so that friction is generated between the sliding support group 34 and the flexible display panel, which easily causes damages such as abrasion to the flexible display panel, and reduces the service life of the flexible display panel.

In a display device in embodiments of the present disclosure, a connection member is provided on a support for supporting a flexible display panel. By driving the connection member to be connected to or disconnected from an adjacent support, a plurality of supports are switched between a rigid support state and a rollable state, so that the plurality of supports and the flexible display panel are prevented from moving relatively in a length direction of the flexible display panel.

The display device in the embodiments of the present disclosure may be a mobile phone, a television, a computer monitor, etc., which is not limited herein.

Figure 3:
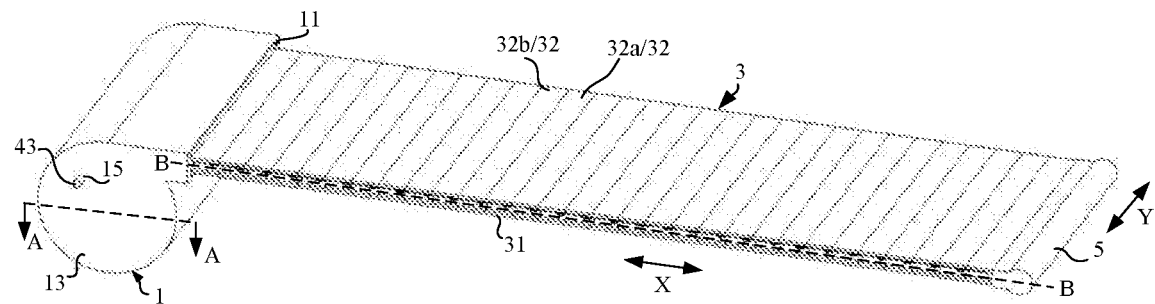
FIG. 3 is a schematic structural diagram of a display device, in accordance with some embodiments of the present disclosure.
Figure 4:
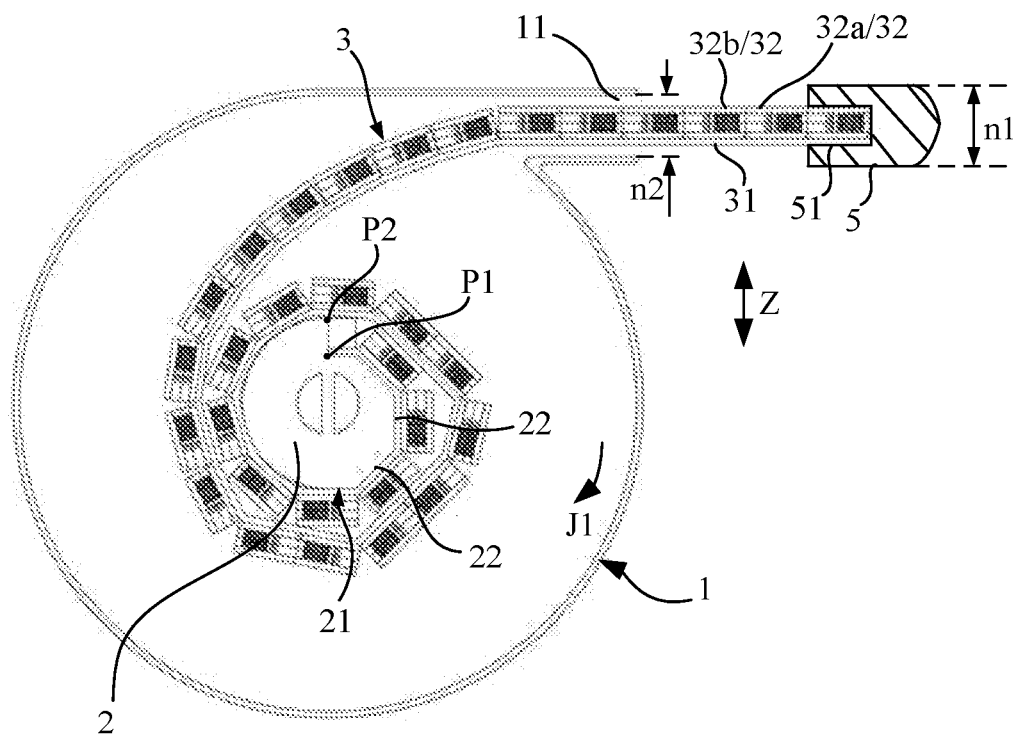
FIG. 4 is a schematic diagram of a display screen of the display device in FIG. 3 being stored in a housing.
Figure 5A:
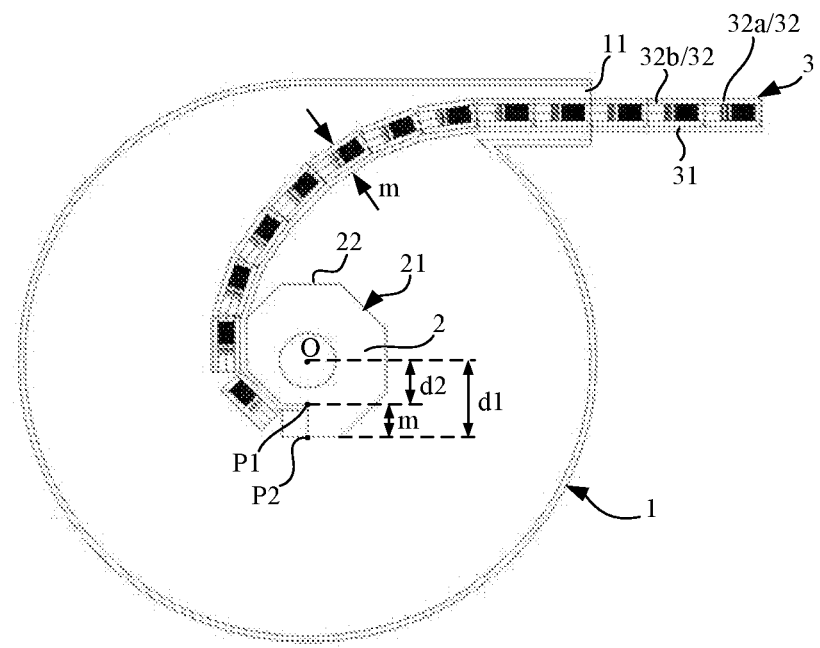
FIG. 5a is a schematic diagram of a display screen of the display device in FIG. 3 extending out of a housing.

As shown in FIGS. 3, 4, and 5*a*, FIG. 3 is a schematic structural diagram of the display device in some embodiments of the present disclosure, FIG. 4 is a schematic diagram of a display screen 3 of the display device in FIG. 3 being received in a housing 1, and FIG. 5*a* is a schematic diagram of the display screen 3 of the display device in FIG. 3 extending out of the housing 1. The display device includes the housing 1, a reel 2 and the display screen 3. The housing 1 is provided with an opening 11, and the opening 11 may allow the display screen 3 to extend out of the housing 1 or retract into the housing 1. The housing 1 may be in a cylindrical shape or in another shape, which may be determined according to an actual situation.

Figure 6:
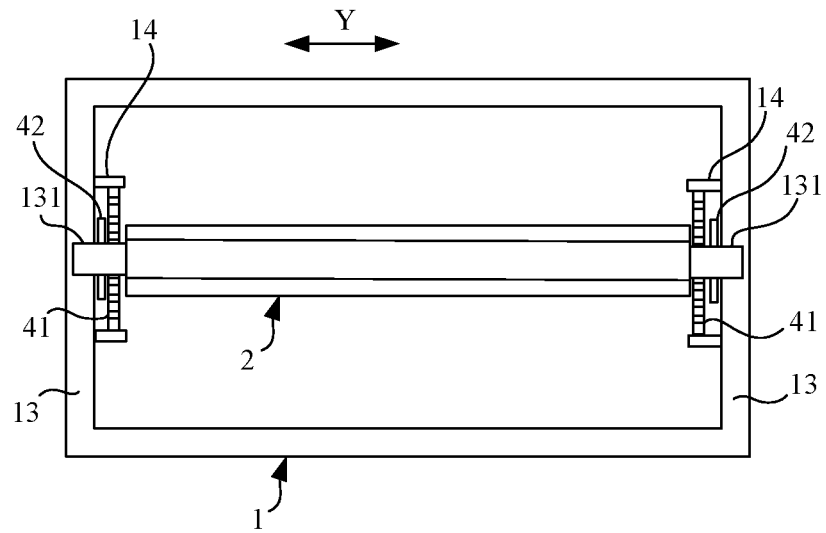
FIG. 6 is a sectional view taken along the A-A line in FIG. 3.

As shown in FIG. 6, FIG. 6 is a sectional view taken along the A-A line in FIG. 3. Two opposite side walls 13 of the housing 1 are each provided with an assembling hole 131, and two ends of the reel 2 extend into the two assembling holes 131, respectively, so that the reel 2 is rotatably arranged in the housing 1.

As shown in FIGS. 3, 4 and 5*a*, a first end of the display screen 3 is connected to the reel 2, the display screen 3 is wound on the reel 2, and a second end of the display screen 3 extends out of the housing 1.

Figure 7:
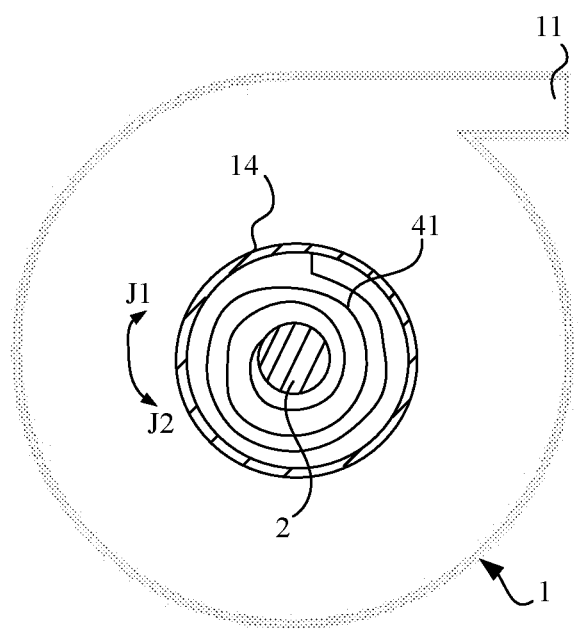
FIG. 7 is a schematic diagram of connection of a reel to a driving spring, in accordance with some embodiments of the present disclosure.
Figure 8:
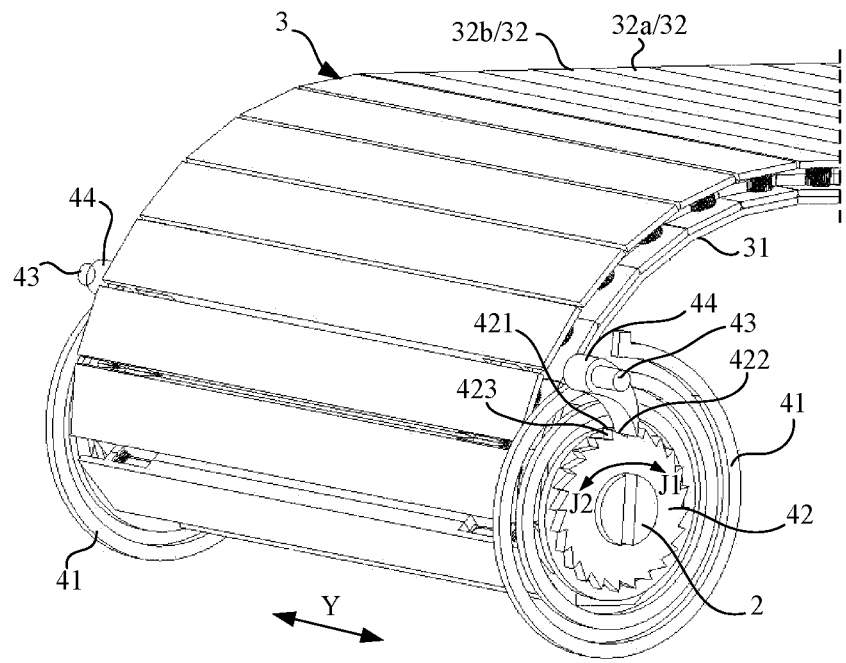
FIG. 8 is a schematic diagram of installation of a ratchet, a pawl and a reel, in accordance with some embodiments of the present disclosure.

As shown in FIGS. 6, 7 and 8, FIG. 7 is a schematic diagram of connection of the reel 2 to a driving spring 41 in some embodiments of the present disclosure, and FIG. 8 is a schematic diagram of installation of a ratchet 42, a pawl 44 and the reel 2 in some embodiments of the present disclosure. The display device further includes the driving spring(s) 41, the ratchet(s) 42, operating shaft(s) 43 and the pawl(s) 44. The driving spring 41 is spirally arranged around the reel 2. An end of the driving spring 41 is connected to the reel 2, and another end of the driving spring 41 is connected to the housing 1.

As shown in FIGS. 7 and 8, the driving spring 41 is configured such that when the reel 2 rotates in a first rotation direction J1, the driving spring 41 may be wound up to apply a reset force to the reel 2 that may drive the reel 2 to rotate in a second rotation direction J2. The first rotation direction J1 is a rotation direction of the reel 2 when the display screen 3 extends out of the housing 1 through the opening 11, and the second rotation direction J2 is an opposite direction to the first rotation direction J1.

The driving spring 41 may be connected to the housing 1 in following manners. As shown in FIGS. 6 and 7, the housing 1 includes fixed cylinder(s) 14 disposed on the side wall(s) 13, respectively, and the end(s) of the reel 2 extends into the fixed cylinder(s) 14, respectively. The end of the driving spring 41 is connected to the end of the reel 2, and the another end of the driving spring 41 is connected to an inner wall of the fixed cylinder 14.

As shown in FIGS. 7 and 8, the ratchet 42 is fixedly sleeved on the reel 2. The ratchet 42 includes a plurality of ratchet teeth 421. Each ratchet tooth 421 includes a tooth back surface 422 and a stop surface 423 arranged in sequence in the second rotation direction J2. A distance from an end of the tooth back surface 422 proximate to the stop surface 423 to a center of the ratchet 42 is greater than a distance from an end of the tooth back surface 422 away from the stop surface 423 to the center of the ratchet 42.

As shown in FIGS. 3 and 8, the side wall 13 of the housing 1 is provided with a through hole 15. The operating shaft 43 is rotatably matched with the through hole 15, so that the operating shaft 43 is rotatably arranged on the housing 1. A portion of the operating shaft 43 extends out of the housing 1 through the through hole 15. The pawl 44 is located in the housing 1 and fixed on the operating shaft 43. The pawl 44 extends into a tooth groove between two adjacent ratchet teeth 421.

As shown in FIGS. 4 and 8, when the display screen 3 extends out of the housing 1 through the opening 11, the reel 2 drives the ratchet 42 to rotate in the first rotation direction J1. In this case, the driving spring 41 is gradually wound up to apply the reset force to the reel 2. Moreover, the pawl 44 slides along the tooth back surface 422 of the ratchet tooth 421, sliding from a tooth groove to an adjacent tooth groove in sequence. When the display screen 3 stops extending out of the housing 1, the pawl 44 abuts against a stop surface 423 of the ratchet tooth 421 in this case to lock the ratchet 42 from rotating, so that the reel 2 is prevented from rotating in the second rotation direction J2, and thus a portion of the display screen 3 extending out of the housing 1 is able to be prevented from retracting into the housing 1 under an action of the driving spring 41, which is convenient for a user to watch images displayed on the display screen 3.

As shown in FIGS. 3 and 8, when the display screen 3 is required to be stored in the housing 1, the user rotates the operating shaft 43 extending out of the housing 1 to disengage the pawl 44 from the tooth groove of the ratchet 42. In this case, the reel 2 may rotate in the second rotation direction J2 under the action of the reset force of the driving spring 41, so that the display screen 3 is gradually wound on the reel 2 to be stored in the housing 1.

In these embodiments, by providing the driving spring 41, after the user finishes using the display screen 3, the display screen 3 may automatically retract into the housing 1 under the action of the driving spring 41, which facilitates the users operation. The reel 2 is locked from rotating by the ratchet mechanism, and this rotation locking method is simple, has a high reliability, and is not prone to failure, which is not only beneficial to reduce a maintenance frequency, but also is convenient for the user to operate.

Of course, in addition to using the ratchet mechanism to prevent the display screen 3 from retracting into the housing 1 under the action of the driving spring 41, a support rod may also be provided between the second end of the display screen 3 and the housing 1, so that the display screen 3 is prevented from retracting into the housing 1 under the action of the driving spring 41 after extending out.

In some embodiments, as shown in FIGS. 6 and 8, two driving springs 41, two ratchets 42, two operating shafts 43, and two pawls 44 are provided. The two driving springs 41 are arranged at the two ends of the reel 2, respectively, the two ratchets 42 are fixedly sleeved on the two ends of the reel 2, respectively, and the two operating shafts 43 are rotatably arranged on the two side walls 13 of the housing 1, respectively. A portion of each operating shaft 43 extends out of the housing 1, and each pawl 44 is fixed on a respective operating shaft 43, and extends into a tooth groove of a ratchet 42.

In these embodiments, by providing the driving springs 41 at the two ends of the reel 2, respectively, the reel 2 is uniformly stressed when the display screen 3 retracts, and the display screen 3 is able to be stably stored in the housing 1. By providing the ratchet mechanisms at the two ends of the reel 2, respectively, when the display screen 3 is in use, the ratchet mechanisms are able to lock t the reel 2 from rotating at the two ends of the reel 2, which may not only make the reel 2 uniformly stressed, but also improve a rotation locking effect of the reel 2.

In some embodiments, the display device further includes a driving motor and a reduction gear set. An output shaft of the driving motor is connected to the reel 2 through the reduction gear set. In this way, the display device is not required to be provided with the driving spring 41 and the ratchet mechanism. The driving motor may drive the reel 2 to rotate through the reduction gear set, so as to control the display screen 3 to extend out or retract, so that the user does not need to manually pull the display screen 3 out of the housing 1, which is beneficial to accurately control an extension length and a retraction length of the display screen 3.

Figure 9:
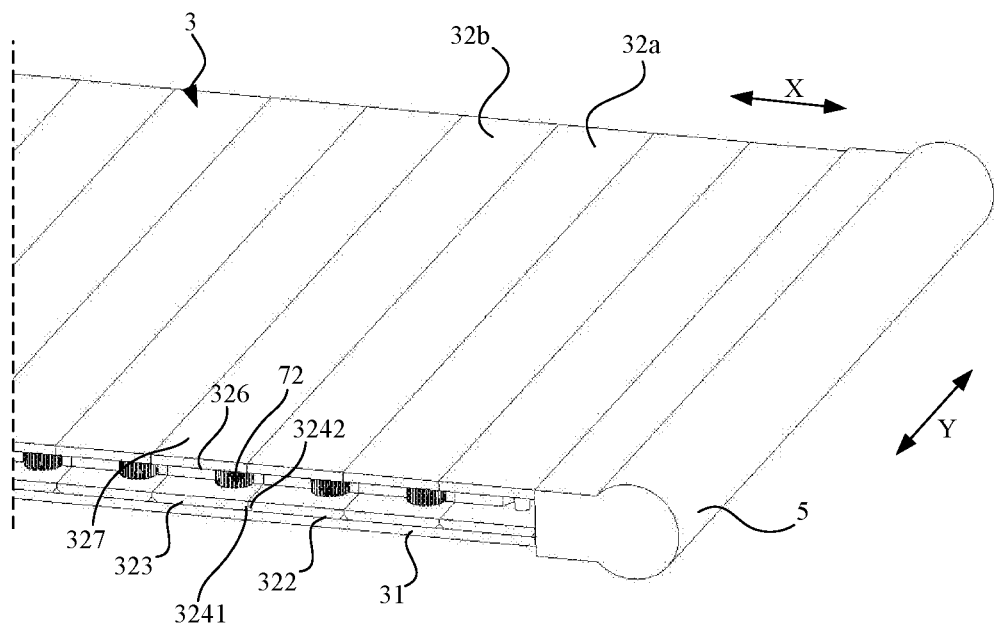
FIG. 9 is a partial enlarged view of a display screen in FIG. 3 proximate to a second end.

In some embodiments, as shown in FIGS. 4 and 9, FIG. 9 is a partial enlarged view of a portion of the display screen 3 in FIG. 3 proximate to the second end. The display device further includes a limiting member 5 with a mounting groove 51. The mounting groove 51 is matched with the second end of the display screen 3 to fix the limiting member 5 on the display screen 3. In a thickness direction Z of the portion of the display screen 3 extending out of the housing 1, a dimension n1 of the limiting member 5 is greater than a dimension n2 of the opening 11. In this way, when the display screen 3 retracts into the housing 1 through the opening 11, the limiting member 5 may be stuck at the opening 11 of the housing 1 to prevent the second end of the display screen 3 from retracting into the housing 1, thereby facilitating the user to pull the display screen 3 out of the housing 1 through the second end of the display screen 3.

In some embodiments, as shown in FIGS. 3 and 4, the display screen 3 includes the flexible display panel 31 and the plurality of supports 32. The plurality of supports 32 are provided on a back side of the flexible display panel 31, and are arranged in a length direction X of the flexible display panel 31.

The flexible display panel 31 may be an organic light-emitting diode (OLED) panel, a quantum dot light-emitting diode (QLED) panel, or a micro LED (including a Mini LED or a Micro LED) panel, which is not limited herein. The back side of the flexible display panel 31 is a side of the flexible display panel 31 facing away from a display side.

Figure 10:
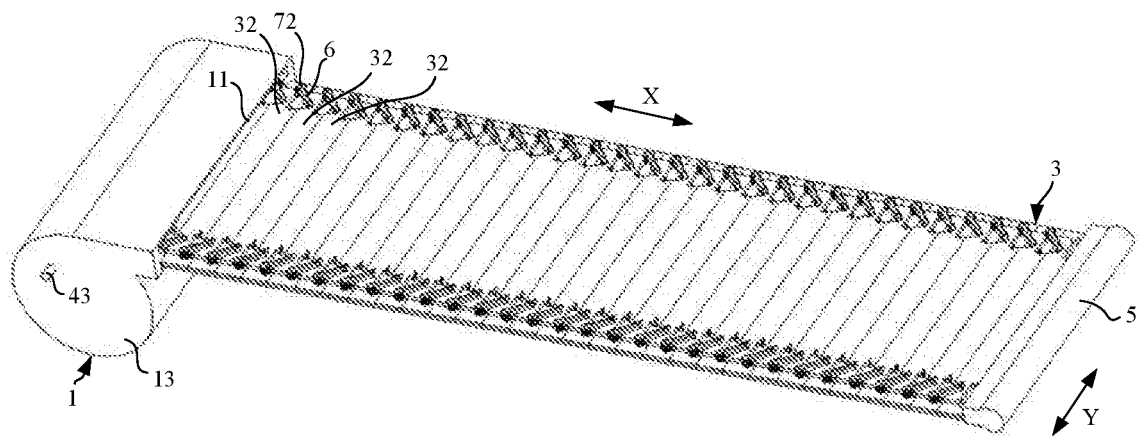
FIG. 10 is a sectional view taken along the B-B line in FIG. 3.
Figure 11:
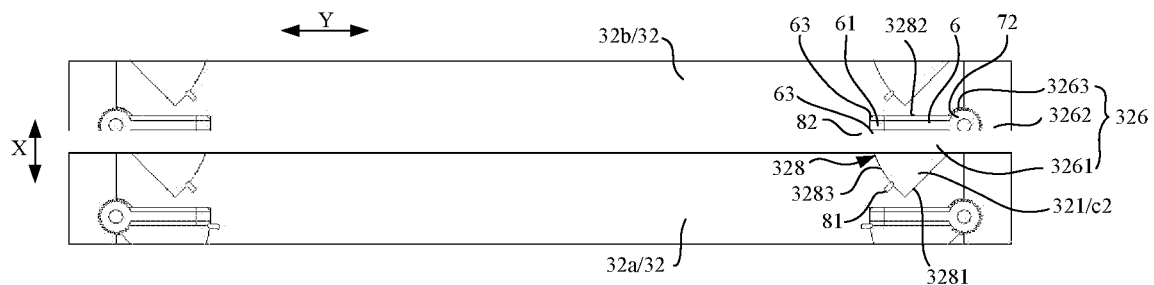
FIG. 11 is a schematic structural diagram of two adjacent supports in FIG. 10.

As shown in FIGS. 9, 10 and 11, FIG. 10 is a sectional view taken along the B-B line in FIG. 3, and FIG. 11 is a schematic structural diagram of two adjacent supports in FIG. 10. A first support 32a and a second support 32b are any two adjacent supports 32 in the plurality of supports 32 of the display screen 3. That is, as shown in FIG. 4, except for the supports 32 located at two ends of the flexible display panel 31 in the length direction X, each support 32 is both a first support 32a and a second support 32b.

The first support 32a includes connection portion(s) 321 and a first surface 322, and the second support 32b includes a second surface 323. The first surface 322 and the second surface 323 are configured to support the flexible display panel 31.

The first surface 322 and the second surface 323 may be adhered to the back side of the flexible display panel 31 to support the flexible display panel 31. In addition, the first support 32a and the second support 32b may also be hinged together, and the first surface 322 and the second surface 323 are in contact with the flexible display panel 31 to support the flexible display panel 31.

Figure 12:
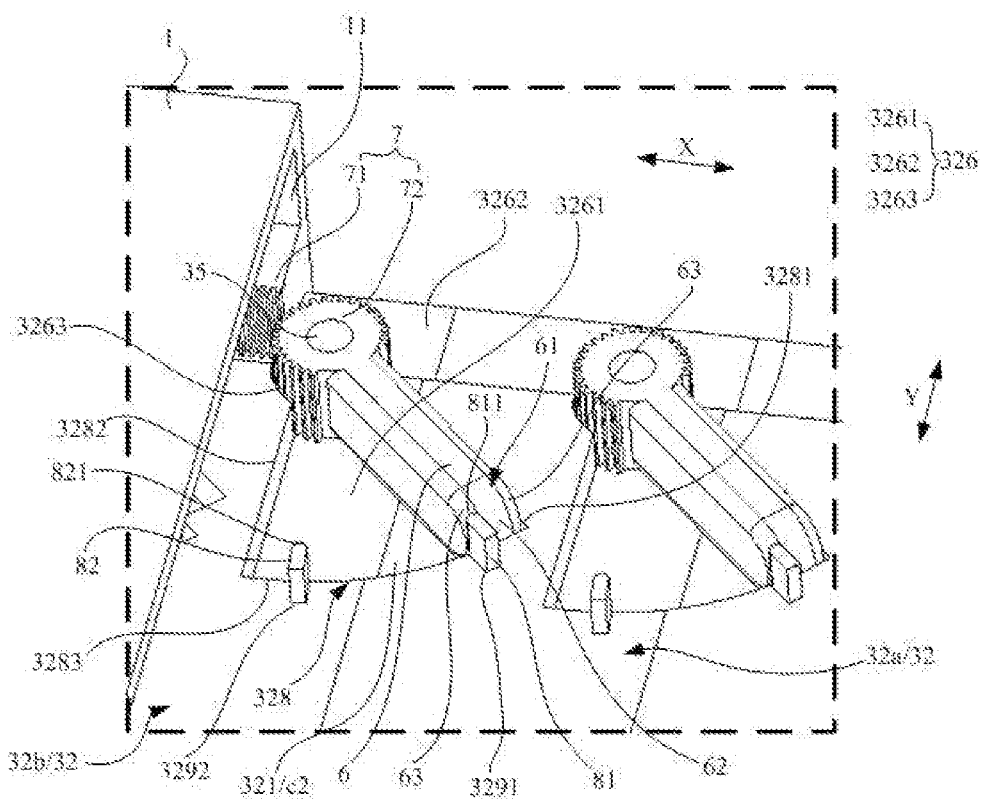
FIG. 12 is a partial view at an opening of the housing in FIG. 10.

As shown in FIGS. 9, 10 and 12, FIG. 12 is a partial view at the opening 11 of the housing 1 in FIG. 10. The display device further includes connection members 6 and a driving apparatus 7. The second supports 32b is provided with connection member(s) 6 thereon.

The driving apparatus 7 is configured such that when the first surface 322 and the second surface 323 are coplanar, the driving apparatus 7 may drive the connection member 6 to move relative to the second support 32b between a first position and a second position. When the connection member 6 is at the first position, as shown in FIG. 12, the connection member 6 is connected to the connection portion 321, so that the second support 32b and the first support 32a are relatively fixed. When the connection member 6 is at the second position, as shown in FIG. 11, the connection member 6 is disconnected from the connection portion 321, so that the display screen 3 is able to be wound on the reel 2.

It will be noted that since each support 32 is both the first support 32a and the second support 32b except for the supports located at the two ends of the flexible display panel 31 in the length direction X, the second support 32b also includes connection portion(s) 321, and the first support 32a is also provided with connection member(s) 6. The connection and disconnection of the connection member 6 and the connection portion 321 may be referred to the above, and will not be repeated here. In a process that the flexible display panel 31 gradually extends out of the housing 1 through the opening 11, the flexible display panel 31 changes from a bent state to a straight state after passing through the opening 11 of the housing 1, then support surfaces of the supports 32 for supporting a straight section of the flexible display panel 31 are coplanar. That is, the first surface 322 of the first support 32a and the second surface 323 of the second support 32b are coplanar (as shown in FIG. 9). In this case, as shown in FIGS. 10 and 12, the driving apparatus 7 drives the connection member 6 on each support 32 to move to the first position, so that each support 32 and an adjacent support 32 are relatively fixed. In this way, the supports 32 for supporting the straight section of the flexible display panel 31 may be relatively fixed, so as to be in the rigid support state. In this case, the flexible display panel 31 may be well supported to ensure the flatness of the flexible display panel 31.

When the flexible display panel 31 is required to be stored in the housing 1, as shown in FIG. 11, the driving apparatus 7 may drive the connection member 6 on each support 32 to move to the second position, so that the connection member 6 is disconnected from the connection portion 321 on the adjacent support 32. In this case, each support 32 and the adjacent support 32 may move relatively to each other, so that the supports 32 are in the rollable state. In this way, the flexible display panel 31 and the plurality of supports 32 may be wound on the reel 2 to be stored in the housing 1.

In these embodiments, the driving apparatus 7 drives the connection member 6 disposed on the support 32 to move between the first position and the second position, so as to switch the supports 32 between the rigid support state and the rollable state. In a process of driving the connection member 6 to move between the first position and the second position by the driving apparatus 7, in the length direction X of the flexible display panel 31, a relative position between each support 32 and the flexible display panel 31 is unchanged, so that damages such as abrasion to the flexible display panel 31 due to a relative movement between the supports 32 and the flexible display panel 31 are avoided, which is beneficial to prolong the service life of the flexible display panel 31.

In some embodiments, as shown in FIG. 9, the second support 32b includes a third rounded surface 3241 disposed on a side of the second surface 323 proximate to the first support 32a. The first support 32a includes a fourth rounded surface 3242 disposed on a side of the first surface 322 proximate to the second support 32b.

By providing the third rounded surface 3241 and the fourth rounded surface 3242, when the display screen 3 is wound on the reel 2, an avoidance space formed between the third rounded surface 3241 and the fourth rounded surface 3242 may avoid a movement interference between the first support 32a and the second support 32b, so that the first support 32a and the second support 32b may move relatively to each other, so as to ensure that the display screen 3 is smoothly wound on the reel 2.

Figure 14:
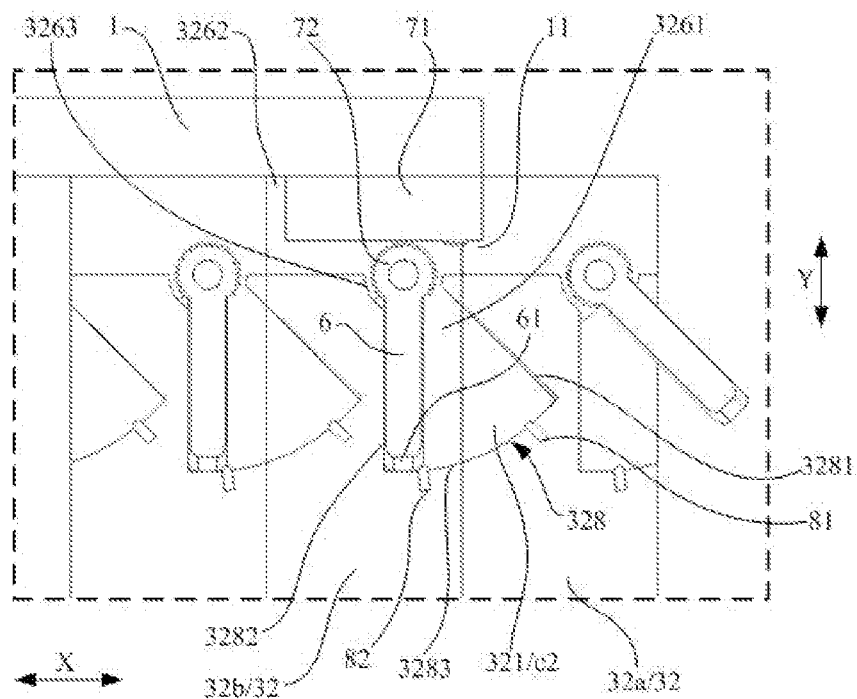
FIG. 14 is a state diagram of a plurality of supports in a process of extending out or retracting relative to a housing at an opening, in accordance with some embodiments of the present disclosure.
Figure 15:
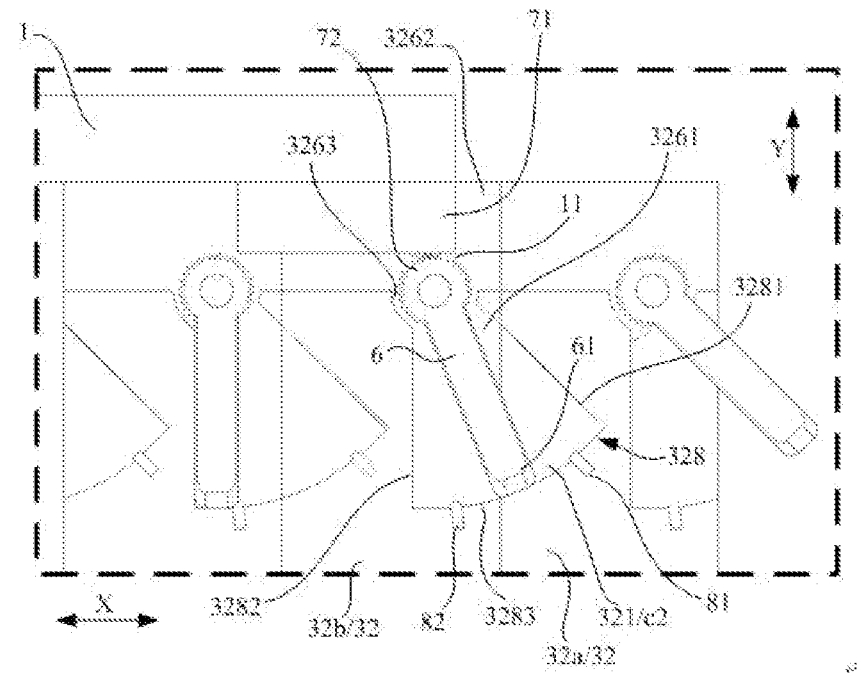
FIG. 15 is a second state diagram of a plurality of supports in a process of extending out or retracting relative to a housing at an opening, in accordance with some embodiments of the present disclosure.
Figure 16:
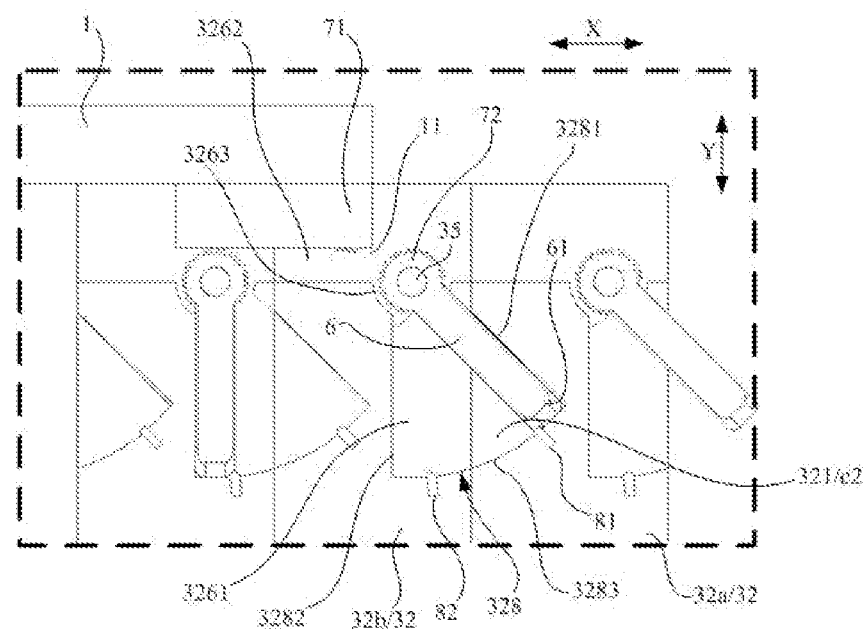
FIG. 16 is a third state diagram of a plurality of supports in a process of extending out or retracting relative to a housing at an opening, in accordance with some embodiments of the present disclosure.

The structure of the driving apparatus 7 and the manner in which the driving apparatus 7 drives the connection member 6 to move are not exclusive. In some embodiments, as shown in FIGS. 10 to 16, FIG. 13 is a schematic structural diagram of the housing 1 in FIG. 10, FIG. 14 is a state diagram of the plurality of supports 32 in a process of extending out or retracting relative to the housing 1 at the opening 11, FIG. 15 is a second state diagram of the plurality of supports 32 in the process of extending out or retracting relative to the housing 1 at the opening 11, and FIG. 16 is a third state diagram of the plurality of supports 32 in the process of extending out or retracting relative to the housing 1 at the opening 11. The driving apparatus 7 includes rack(s) 71 and pinions 72.

Figure 13:
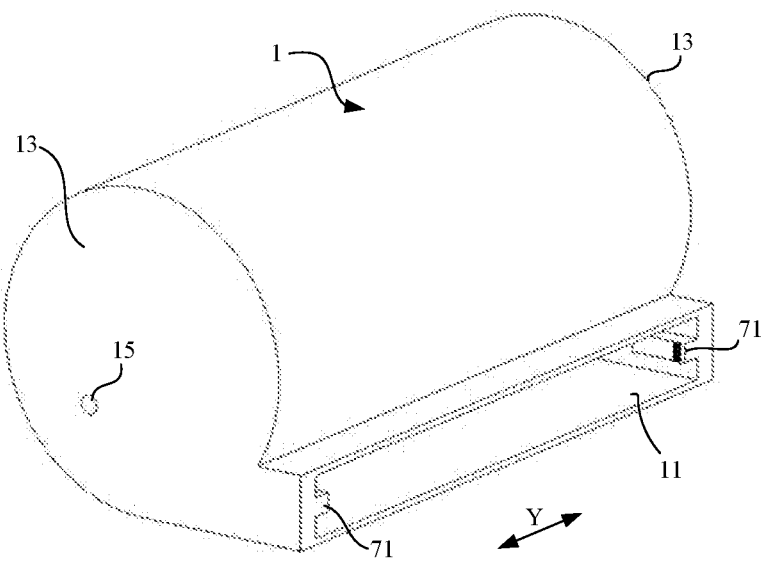
FIG. 13 is a schematic structural diagram of the housing in FIG. 10.

As shown in FIGS. 12 and 13, the rack 71 is fixedly provided at the opening 11, and an extending direction of the rack 71 is parallel to the length direction X of the flexible display panel 31.

As shown in FIGS. 11 and 12, the pinion 72 is rotatably provided on the second support 32b through a rotation shaft 35, and is fixedly connected to the connection member 6. The pinion 72 is configured such that when the first surface 322 and the second surface 323 are coplanar, and the display screen 3 extends out or retracts relative to the housing 1 through the opening 11, the pinion 72 may be engaged with the rack 71 to drive the connection member 6 to rotate between the first position and the second position.

As shown in FIGS. 14, 15 and 16, the rightward direction in the figures is a direction in which the plurality of supports 32 extend out of the housing 1. In the process that the plurality of supports 32 extend out of the housing 1 through the opening 11 with the flexible display panel 31, the pinion 72 disposed on the second support 32b is gradually engaged with the rack 71 located at the opening 11. The movement of the second support 32b toward an outside of the housing 1 rotates the pinion 72 counterclockwise, so as to drive the connection member 6 to rotate from the second position to the first position, so that the connection member 6 is connected to the connection portion 321 on the first support 32a.

As shown in FIGS. 16, 15 and 14, the leftward direction in the figures is a direction in which the plurality of supports 32 retract into the housing 1. In the process that the plurality of supports 32 retract into the housing 1 through the opening 11 with the flexible display panel 31, the pinion 72 disposed on the second support 32b is gradually engaged with the rack 71 located at the opening 11. The movement of the second support 32b toward an inside of the housing 1 rotates the pinion 72 clockwise, so as to drive the connection member 6 to rotate from the first position to the second position, so that the connection member 6 is disconnected from the connection portion 321 on the first support 32a.

In these embodiments, the driving apparatus 7 drives the connection member 6 to move between the first position and the second position by driving the connection member 6 to rotate. The driving apparatus 7 has a simple structure and a high reliability, which may not only reduce the probability of damage, but also is energy-saving and environment-friendly without consuming electric energy.

Figure 28:
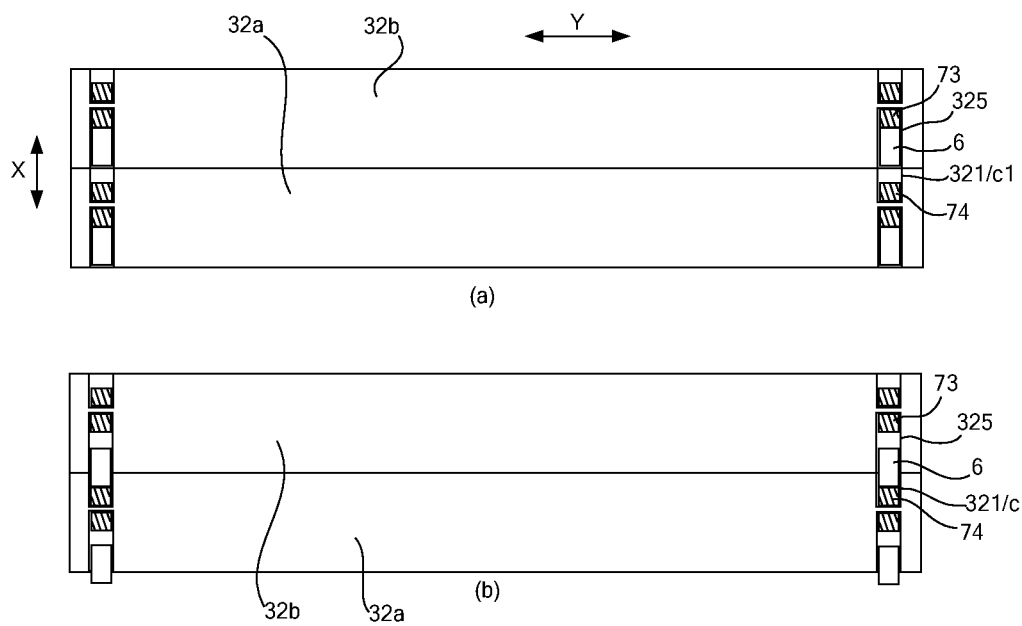
FIG. 28 is a state diagram of a driving apparatus driving a connection member to move, in accordance with some embodiments of the present disclosure.

In some other embodiments, as shown in FIG. 28, FIG. 28 is a schematic structural diagram of another driving apparatus 7. The driving apparatus 7 includes first electromagnetic attraction members 73 and second electromagnetic attraction members 74.

A side surface of the second support 32b proximate to the first support 32a is provided with accommodation hole(s) 325, and the first electromagnetic attraction member 73 is provided in the accommodation hole 325. The connection member 6 is a magnetic pin, and is slidably matched with the accommodation hole 325.

The connection portion 321 is a clamping hole c1, and is provided in a side surface of the first support 32a proximate to the second support 32b. The second electromagnetic attraction member 74 is disposed in the clamping hole c1.

The first electromagnetic attraction member 73 is configured such that as shown in (a) of FIG. 28, when the first electromagnetic attraction member 73 is energized, the connection member 6 may be attracted to and attached to the first electromagnetic attraction member 73, so that the connection member 6 is located in the accommodation hole 325, and thus is located at the second position. The second electromagnetic attraction member 74 is configured such that as shown in (b) of FIG. 28, when the second electromagnetic attraction member 74 is energized, the connection member 6 is attracted to and attached to the second electromagnetic attraction member 74, so that a portion of the connection member 6 extends into the clamping hole c1, and thus the connection member 6 is located at the first position.

In these embodiments, the driving apparatus 7 drives the connection member 6 to move between the first position and the second position by driving the connection member 6 to move.

The first electromagnetic attraction member 73 and the second electromagnetic attraction member 74 may be electromagnets.

Figure 17:
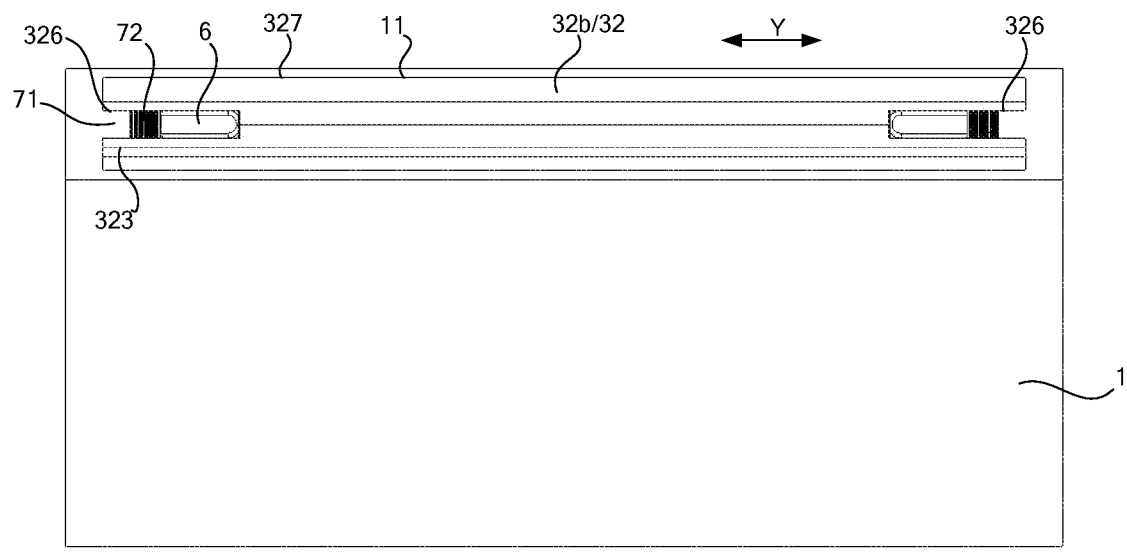
FIG. 17 is a schematic structural diagram of a display screen matched with an opening of a housing, in accordance with some embodiments of the present disclosure.
Figure 18:
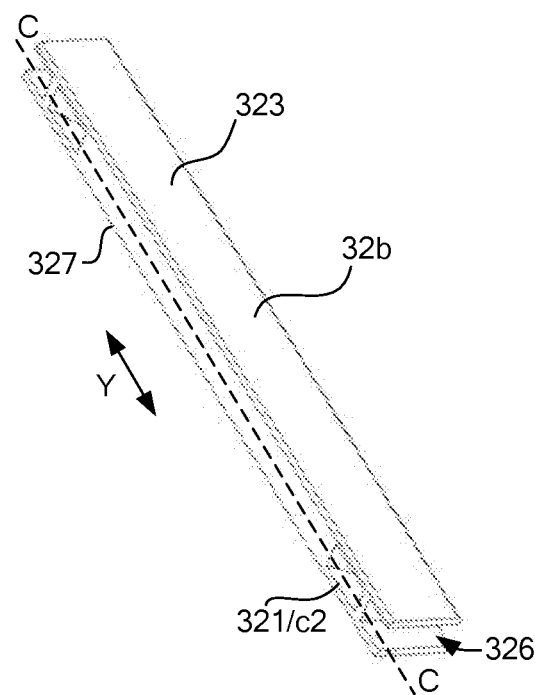
FIG. 18 is a schematic structural diagram of a second support, in accordance with some embodiments of the present disclosure.
Figure 19:
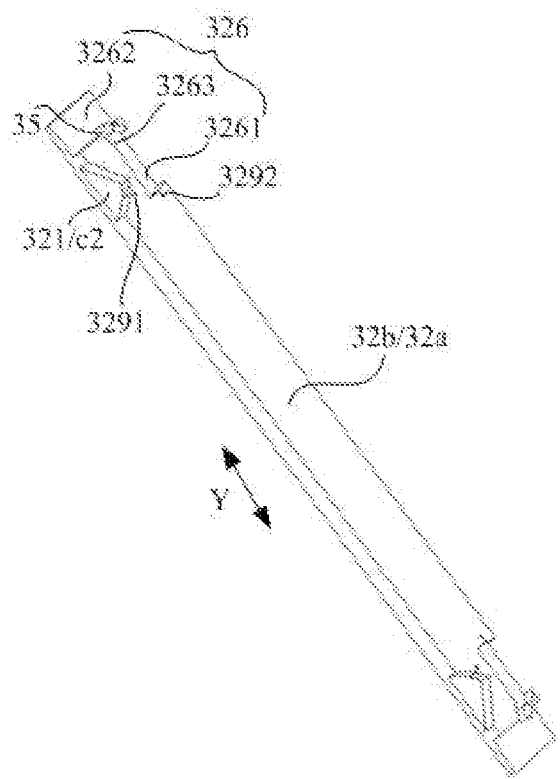
FIG. 19 is a sectional view taken along the C-C line in FIG. 18.

In some embodiments, as shown in FIGS. 16 to 19, FIG. 17 is a schematic structural diagram of the display screen 3 matched with the opening 11 of the housing 1, FIG. 18 is a schematic structural diagram of the second support 32b (or the first support 32a), and FIG. 19 is a sectional view taken along the C-C line in FIG. 18. In a width direction Y of the flexible display panel 31, end(s) of the second support 32b are provided with an accommodation space 326.

The second support 32b further includes a third surface 327 arranged opposite to the second surface 323. The accommodation space 326 is located between the third surface 327 and the second surface 323, and penetrates through the two ends of the second support 32b in the length direction X of the flexible display panel.

The pinion 72 and the connection member 6 are both provided in the accommodation space 326. The rack 71 is configured such that the rack 71 may extend into the accommodation space 326 to be engaged with the pinion 72.

In these embodiments, since the accommodation space 326 is located between the third surface 327 and the second surface 323 of the second support 32b, and the pinion 72 and the connection member 6 are both provided in the accommodation space 326, the pinion 72 and the connection member 6 may make full use of an inner space of the second support 32b without occupying a space other than the second support 32b, which is beneficial to reduce a thickness of the display screen 3.

In some embodiments, as shown in FIGS. 17-19, in the width direction Y of the flexible display panel 31, two ends of the second support 32b are each provided with the accommodation space 326, and each accommodation space 326 is provided with a connection member 6 and a pinion 72.

Accordingly, in the width direction Y of the flexible display panel 31, two ends of the first support 32a are each provided with a connection portion 321, and two ends of the opening 11 of the housing 1 are each provided with a rack 71 (as shown in FIG. 13). In this way, when the display screen 3 extends out or retracts relative to the housing 1, the racks 71 located at the two ends of the opening 11 may each extend into a corresponding accommodation space 326 to be engaged with the pinion 72, so as to drive the connection member 6 to rotate between the first position and the second position. By such an arrangement, when the connection member 6 is at the first position, the first support 32a and the second support 32b may be prevented from shaking in the width direction Y of the flexible display panel 31, so that the first support 32a and the second support 32b may be connected firmly.

The structure of the connection portion 321 is not exclusive. In some embodiments, as shown in FIG. 12, the connection portion 321 is a clamping groove c2, and the clamping groove c2 is provided in the side surface of the first support 32a proximate to the second support 32b. The accommodation space 326 and the clamping groove c2 are configured such that when the first surface 322 and the second surface 323 are coplanar, the clamping groove c2 and the accommodation space 326 are arranged opposite to each other (that is, an orthogonal projection of the clamping groove c2 on the second support 32b is overlapped with the accommodation space 326), so that the connection member 6 may cooperatively extend into the clamping groove c2 from the accommodation space 326 to make the connection member 6 at the first position (i.e., the position of the connection member 6 in FIG. 12).

In these embodiments, by providing the connection portion 321 as the clamping groove c2, the structure of the connection portion 321 is simple, which is beneficial to reduce the manufacturing cost of the connection portion 321. Moreover, the connection member 6 and the connection portion 321 may be connected by cooperatively extending the connection member 6 into the clamping groove c2. In this way, each second support 32b and the first support 32a may be connected firmly, so as to support the flexible display panel 31 well.

Figure 20:
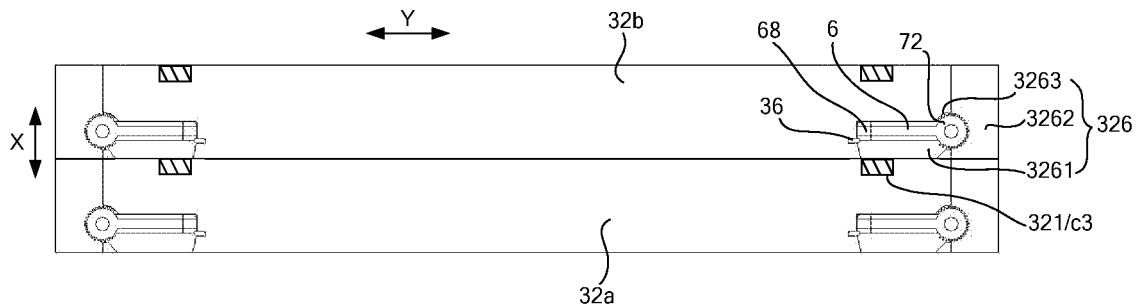
FIG. 20 is a schematic structural diagram of a connection portion of a first support, in accordance with some embodiments of the present disclosure.

In some other embodiments, as shown in FIG. 20, FIG. 20 shows a structure of another connection portion 321 of the first support 32a. The connection portion 321 is a magnetic attraction member c3, and the magnetic attraction member c3 is provided on a side of the first support 32a proximate to the second support 32b. The connection member 6 includes a magnetic attraction portion 68.

The accommodation space 326 and the magnetic attraction member c3 are configured such that when the first surface 322 and the second surface 323 are coplanar, the magnetic attraction member c3 and the accommodation space 326 are arranged opposite to each other, so that the magnetic attraction portion 68 of the connection member 6 may cooperatively extend out of the accommodation space 326, and be attracted to and fixed to the magnetic attraction member c3, so as to make the connection member 6 at the first position.

In these embodiments, by providing the connection portion 321 as the magnetic attraction member c3, the connection member 6 is connected to the connection portion 321 under an action of a magnetic attraction force. When the display screen 3 is strongly bent after extending out of the housing 1, in this case, the connection member 6 may be disconnected from the magnetic attraction member c3, so that the supports 32 are switched to the rollable state, thereby preventing the connection member 6 and the first support 32a from being damaged.

As shown in FIG. 20, when the connection member 6 is at the second position, in order to prevent the connection member 6 from rotating to the first position under the action of the magnetic attraction force of the magnetic attraction member c3, the accommodation space 326 is provided with an elastic limiting portion 36 therein. The elastic limiting portion 36 is configured such that when the connection member 6 is at the second position (i.e., the position of the connection member 6 in FIG. 20), the elastic limiting portion 36 may abut against a side surface of the connection member 6 proximate to the magnetic attraction member c3, so as to prevent the connection member 6 from rotating to the first position.

Figure 21:
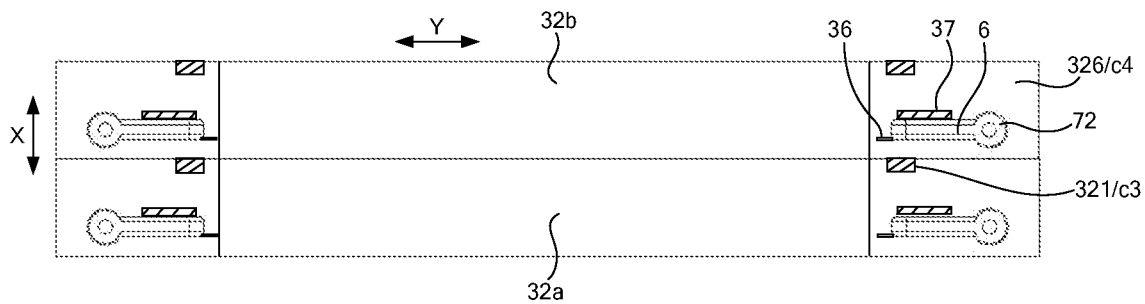
FIG. 21 is a schematic diagram of an arrangement of a pinion and a connection member in an accommodation space, in accordance with some embodiments of the present disclosure.

The structure of the accommodation space 326 is not exclusive. In some embodiments, as shown in FIG. 21, FIG. 21 is a schematic diagram of an arrangement of the pinion 72 and the connection member 6 in the accommodation space 326. The accommodation space 326 is a groove c4, and the groove c4 is provided in an end surface of the second support 32b in the width direction Y of the flexible display panel 31, and penetrates through the two ends of the second support 32b in the length direction X of the flexible display panel 31.

The groove c4 is provided with a limiting rib 37 therein. The limiting rib 37 is configured such that when the connection member 6 is at the second position (i.e., the position of the connection member 6 in FIG. 21), a side surface of the limiting rib 37 proximate to the first support 32a abuts against the connection member 6 to prevent the connection member 6 from rotating further.

In some other embodiments, as shown in FIGS. 16, 18, and 19, the accommodation space 326 includes an accommodation groove 3261 and a limiting groove 3262. The accommodation groove 3261 is provided in the side surface of the second support 32b proximate to the first support 32a. The limiting groove 3262 is provided in the end surface of the second support 32b in the width direction Y of the flexible display panel 31, and penetrates through the two ends of the second support 32b in the length direction X of the flexible display panel 31.

The accommodation groove 3261 has a communication port 3263 communicated with the limiting groove 3262. The pinion 72 is rotatably provided at the communication port 3263 through the rotation shaft 35, and the rack 71 is configured such that the rack 71 may extend into the limiting groove 3262 to be engaged with the pinion 72.

At least one portion of the connection member 6 is located in the accommodation groove 3261. The accommodation groove 3261 and the clamping groove c2 are configured such that when the first surface 322 and the second surface 323 are coplanar, the clamping groove c2 and the accommodation groove 3261 are arranged opposite to each other (that is, the orthogonal projection of the clamping groove c2 on the second support 32b is overlapped with the accommodation groove 3261), so that the connection member 6 may cooperatively extend into the clamping groove c2 from the accommodation groove 3261 to make the connection member 6 at the first position.

In these embodiments, the accommodation space 326 is provided as the accommodation groove 3261 and the limiting groove 3262. The accommodation groove 3261 mainly accommodates the connection member 6. A groove wall of the accommodation groove 3261 may limit the connection member 6 to limit a rotation range of the connection member 6, so that an additional rotation limiting member is not required. The limiting groove 3262 is mainly used to be matched with the rack 71 to limit and guide the support 32, so that not only the pinion 72 is ensured to be accurately engaged with the rack 71, but also the shaking of the entire display screen 3 when extending out or retracting through the opening 11 may be reduced.

In some embodiments, as shown in FIGS. 11 and 12, the accommodation groove 3261 and the clamping groove c2 are configured such that when the first surface 322 and the second surface 323 are coplanar, the accommodation groove 3261 and the clamping groove c2 are matched to form a fan-shaped groove 328. The fan-shaped groove 328 includes a first groove wall 3281 on the first support 32a, a second groove wall 3282 on the second support 32b, and an arc-shaped groove wall 3283 connected between the first groove wall 3281 and the second groove wall 3282. The communication port 3263 is provided at a position proximate to an apex of the fan-shaped groove 328.

The connection member 6 is configured such that as shown in FIG. 12, when at the first position, the connection member 6 abuts against the first groove wall 3281, and as shown in FIG. 11, when at the second position, the connection member 6 is located in the accommodation groove 3261, and abuts against the second groove wall 3282.

In these embodiments, since the accommodation groove 3261 and the clamping groove c2 may be matched to form the fan-shaped groove 328, the fan-shaped groove 328 may be matched with the movement track of the connection member 6, so that the first groove wall 3281 and the second groove wall 3282 of the fan-shaped groove 328 may accurately limit the first position and the second position, so as to accurately control a rotation angle of the connection member 6.

In some embodiments, as shown in FIG. 16, the rotation angle of the connection member 6 between the first position and the second position may be set to 45 degrees. That is, an included angle between the first groove wall 3281 and the second groove wall 3282 of the fan-shaped groove 328 is 45 degrees. In this way, an interference of the movement track of the connection member 6 with surrounding structures may be reduced.

In order to ensure that the connection member 6 is able to rotate by 45 degrees, as shown in FIG. 16, the number of teeth of the rack 71 is 4, and the modulus of the rack 71 is 0.1. A reference diameter of the pinion 72 is 3.2 mm, the modulus of the pinion 72 is 0.1, and the number of teeth of the pinion 72 is 32. Since the connection member 6 is connected to the pinion 72, which occupies a part of space for arranging the teeth, the pinion 72 in FIG. 16 is a special-shaped pinion 72 with the number of teeth of 24. In this way, from the initial engagement with the rack 71 to the disengagement from the rack 71, the pinion 72 rotates by an angle of 4 teeth, i.e., one eighth of a circumference, i.e., 45 degrees. Therefore, the pinion 72 may drive the connection member 6 to rotate by 45 degrees.

In some embodiments, as shown in FIGS. 11 and 12, the display device further includes first elastic limiting members 81 and second elastic limiting members 82.

A portion of the first elastic limiting member 81 is located in the clamping groove c2. Of course, the first elastic limiting member 81 may also be entirely provided in the clamping groove c2. The first elastic limiting member 81 is configured such that as shown in FIG. 12, when the connection member 6 is at the first position, the first elastic limiting member 81 may abut against the connection member 6 to prevent the connection member 6 from rotating to the second position, and when the connection member 6 rotates between the first position and the second position, the first elastic limiting member 81 may be deformed under an extrusion of the connection member 6 to avoid the movement track of the connection member 6.

A portion of the second elastic limiting member 82 is located in the accommodation space 326. Of course, the second elastic limiting member 82 may also be entirely provided in the accommodation space 326. The second elastic limiting member 82 is configured such that as shown in FIG. 11, when the connection member 6 is at the second position, the second elastic limiting member 82 abuts against the connection member 6 to prevent the connection member 6 from rotating to the first position, and when the connection member 6 rotates between the first position and the second position, the second elastic limiting member 82 may be deformed under the extrusion of the connection member 6 to avoid the movement track of the connection member 6.

In these embodiments, by providing the first elastic limiting member 81 and the second elastic limiting member 82, the connection member 6 may be prevented from occurring at a position between the first position and the second position, and thus when the display screen 3 extends out or retracts relative to the housing 1, the rotation angle of the connection member 6 may be accurately controlled, so that the connection member 6 is located at the first position or the second position.

In some embodiments, as shown in FIGS. 11 and 12, the connection member 6 is rod-shaped. An end of the connection member 6 is fixedly connected to the pinion 72, and another end of the connection member 6 is an abutting portion 61.

The first elastic limiting member 81 is configured such that as shown in FIG. 12, when the connection member 6 is at the first position, the first elastic limiting member 81 may abut against the abutting portion 61 to prevent the connection member 6 from rotating to the second position. The second elastic limiting member 82 is configured such that as shown in FIG. 11, when the connection member 6 is at the second position, the second elastic limiting member 82 may abut against the abutting portion 61 to prevent the connection member 6 from rotating to the first position.

In these embodiments, since the abutting portion 61 is located at the end of the connection member 6 away from the pinion 72, the first elastic limiting member 81 and the second elastic limiting member 82 are provided to abut against the abutting portion 61, so that force arms of forces for limiting the rotation of the connection member 6 by the first elastic limiting member 81 and the second elastic limiting member 82 are large, and the first elastic limiting member 81 and the second elastic limiting member 82 have a good limiting effect on the connection member 6. Thus, when the pinion 72 does not drive the connection member 6 to rotate, the connection member 6 is not easy to be separated from the first elastic limiting member 81 or the second elastic limiting member 82.

Figure 27:
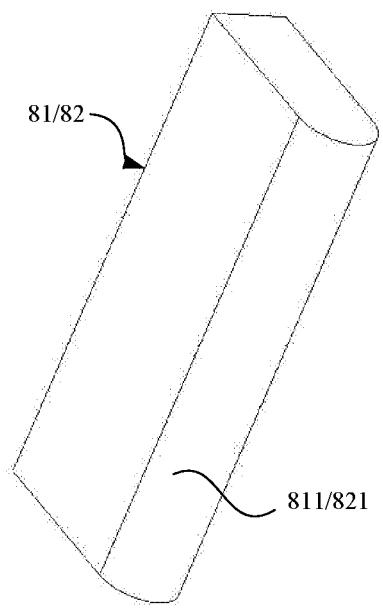
FIG. 27 is a schematic structural diagram of a first elastic limiting member or a second elastic limiting member, in accordance with some embodiments of the present disclosure.

In some embodiments, as shown in FIGS. 12 and 27, FIG. 27 is a schematic structural diagram of the first elastic limiting member 81 or the second elastic limiting member 82. The first elastic limiting member 81 includes a first circular arc surface 811 configured to abut against the abutting portion 61. The second elastic limiting member 82 includes a second circular arc surface 821 configured to abut against the abutting portion 61.

In these embodiments, by abutting the first circular arc surface 811 and the second circular arc surface 821 against the abutting portion 61, when the pinion 72 rotates, the connection member 6 is able to smoothly escape the limitation of the first elastic limiting member 81 or the second elastic limiting member 82 under the driving of the pinion 72, thereby ensuring that the connection member 6 is able to smoothly rotate between the first position and the second position under the driving of the pinion 72, so as to avoid jamming between the connection member 6 and the first elastic limiting member 81 and jamming between the connection member 6 and the second elastic limiting member 82.

In some embodiments, as shown in FIG. 12, a groove wall of the clamping groove c2 is provided with a first fixing groove 3291 therein, and the first elastic limiting member 81 is matched with the first fixing groove 3291. A groove wall of the accommodation groove 3261 is provided with a second fixing groove 3292 therein, and the second elastic limiting member 82 is matched with the second fixing groove 3292. By such an arrangement, the first elastic limiting member 81 and the second elastic limiting member 82 may be conveniently assembled and disassembled.

As shown in FIG. 12, the first fixing groove 3291 is provided in an arc-shaped groove wall of the clamping groove c2, and the second fixing groove 3292 is provided in an arc-shaped groove wall of the accommodation groove 3261.

Figure 22:
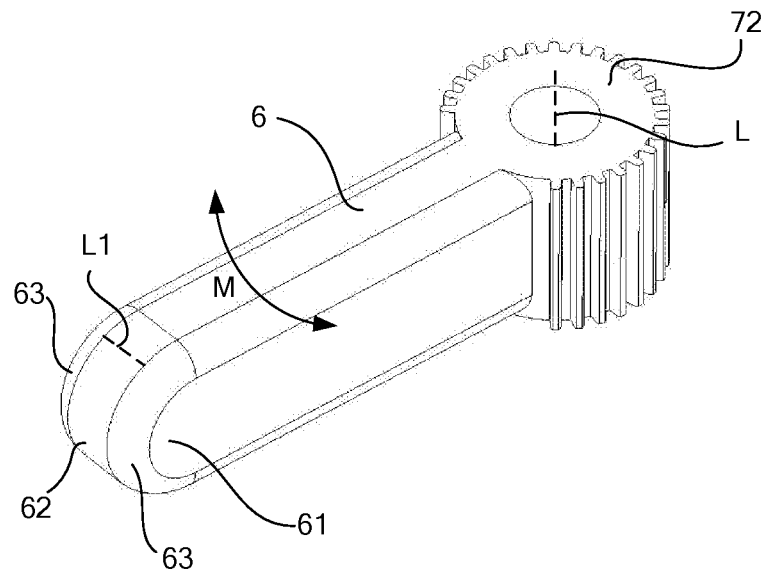
FIG. 22 is a schematic structural diagram of a connection member, in accordance with some embodiments of the present disclosure.

The shape of the abutting portion 61 is not exclusive. In some embodiments, as shown in FIG. 22, the abutting portion 61 includes a first cylindrical surface 62 and two first rounded surfaces 63. A generatrix L1 of the first cylindrical surface 62 is perpendicular to a central axis L of the pinion 72. In a rotation direction M of the connection member 6, the two first rounded surfaces 63 are located at two end edges of the first cylindrical surface 62, respectively.

The first elastic limiting member 81 is configured such that as shown in FIG. 12, when the connection member 6 is at the first position, the first elastic limiting member 81 may abut against the first rounded surface 63 proximate to the second support 32*b*. The second elastic limiting member 82 is configured such that as shown in FIG. 11, when the connection member 6 is at the second position, the second elastic limiting member 82 may abut against the first rounded surface 63 proximate to the first support 32*a*.

In these embodiments, as shown in FIG. 12, the first elastic limiting member 81 abuts against the first rounded surface 63 proximate to the second support 32*b*, so that the jamming between the first elastic limiting member 81 and the connection member 6 may be well avoided, and thus the connection member 6 is able to smoothly escape the limitation of the first elastic limiting member 81 to rotate to the second position under the driving of the pinion 72. As shown in FIG. 11, the second elastic limiting member 82 abuts against the first rounded surface 63 proximate to the first support 32*a*, so that the jamming between the second elastic limiting member 82 and the connection member 6 may be well avoided, and thus the connection member 6 is able to smoothly escape the limitation of the second elastic limiting member 82 to rotate to the first position under the driving of the pinion 72.

Figure 23:
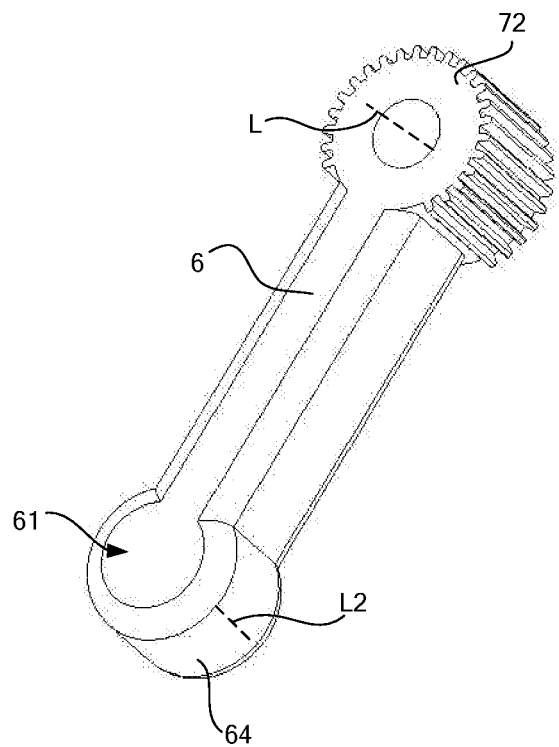
FIG. 23 is a schematic structural diagram of another connection member, in accordance with some embodiments of the present disclosure.

In some other embodiments, as shown in FIG. 23, the abutting portion 61 includes a second cylindrical surface 64, and a generatrix L2 of the second cylindrical surface 64 is parallel to the central axis L of the pinion 72.

Figure 24:
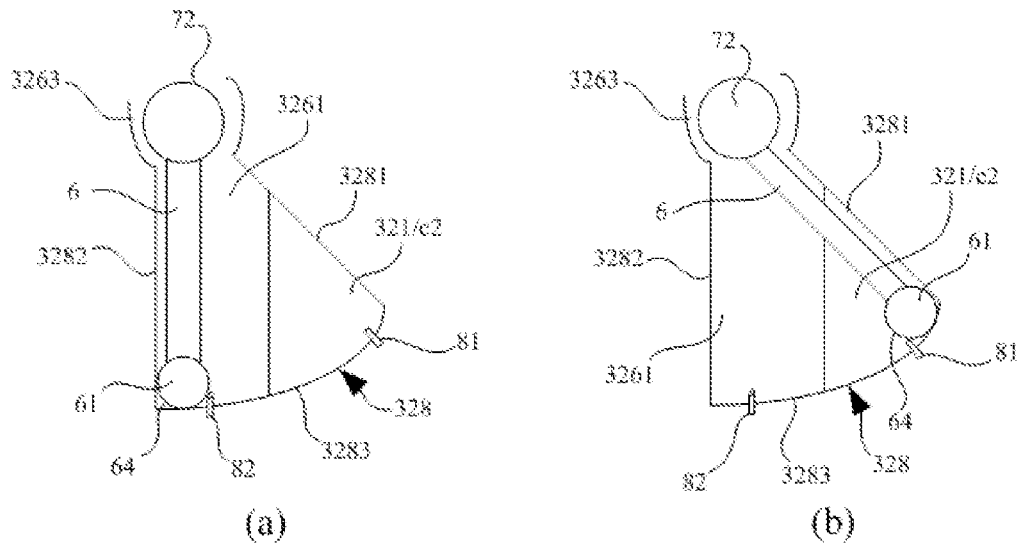
FIG. 24 is a state diagram of the connection member in FIG. 23 rotating between a first position and a second position.

The first elastic limiting member 81 is configured such that as shown in (b) of FIG. 24, when the connection member 6 is at the first position, the first elastic limiting member 81 may abut against a side of the second cylindrical surface 64 proximate to the second support 32*b*. The second elastic limiting member 82 is configured such that as shown in (a) of FIG. 24, when the connection member 6 is at the second position, the second elastic limiting member 82 may abut against a side of the second cylindrical surface 64 proximate to the first support 32*a*.

In these embodiments, by abutting the first elastic limiting member 81 and the second elastic limiting member 82 against the second cylindrical surface 64 of the abutting portion 61, when the pinion 72 rotates, the connection member 6 may smoothly escape the limitation of the first elastic limiting member 81 or the second elastic limiting member 82 under the driving of the pinion 72, so as to smoothly rotate between the first position and the second position, thereby avoiding the jamming between the connection member 6 and the first elastic limiting member 81 and the jamming between the connection member 6 and the second elastic limiting member 82.

Figure 25:
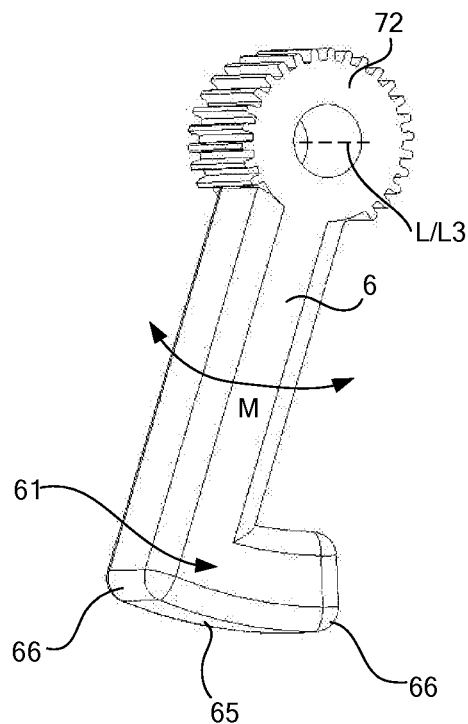
FIG. 25 is a schematic structural diagram of yet another connection member, in accordance with some embodiments of the present disclosure.

In some other embodiments, as shown in FIG. 25, the abutting portion 61 includes a third cylindrical surface 65 and two second rounded surfaces 66. A central axis L3 of the third cylindrical surface 65 coincides with the central axis L of the pinion 72. In the rotation direction M of the connection member 6, the two second rounded surfaces 66 are located at two end edges of the third cylindrical surface 65, respectively.

The central axis L3 of the third cylindrical surface 65 is a central axis of a cylinder where the third cylindrical surface 65 is located.

Figure 26:
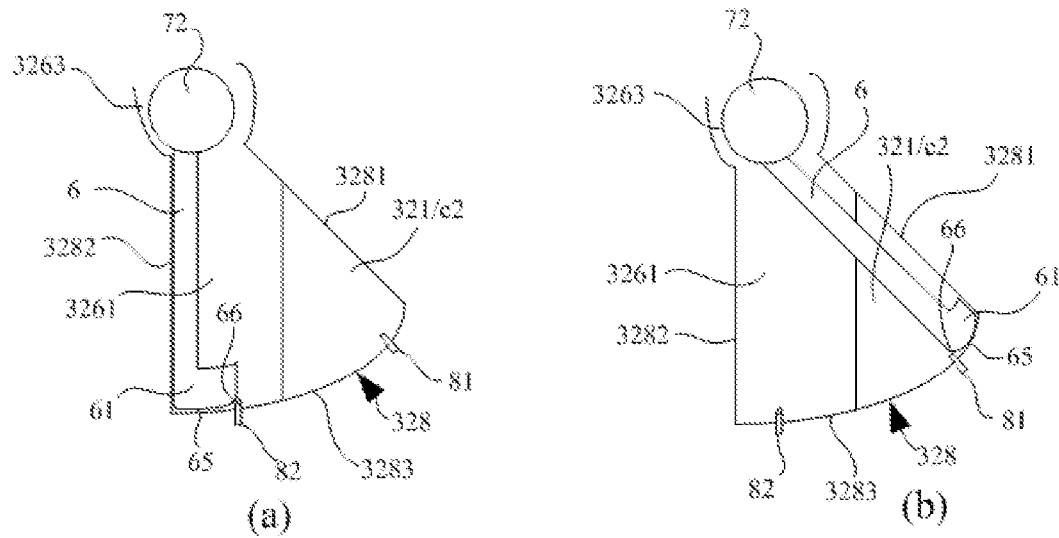
FIG. 26 is a state diagram of the connection member in FIG. 25 rotating between a first position and a second position.

The first elastic limiting member 81 is configured such that as shown in (b) of FIG. 26, when the connection member 6 is at the first position, the first elastic limiting member 81 may abut against the second rounded surface 66 proximate to the second support 32*b*. As shown in (a) of FIG. 26, the second elastic limiting member 82 is configured such that when the connection member 6 is at the second position, the second elastic limiting member 82 may abut against the second rounded surface 66 proximate to the first support 32*a*.

In these embodiments, by abutting the first elastic limiting member 81 against the second rounded surface 66 proximate to the second support 32*b*, the jamming between the first elastic limiting member 81 and the connection member 6 may be well avoided, which ensures that when the pinion 72 rotates, the connection member 6 may be smoothly driven to escape the limitation of the first elastic limiting member 81 to rotate to the second position. By abutting the second elastic limiting member 82 against the second rounded surface 66 proximate to the first support 32*a*, the jamming between the second elastic limiting member 82 and the connection member 6 may be well avoided, which ensures that when the pinion 72 rotates, the connection member 6 may be smoothly driven to escape the limitation of the second elastic limiting member 82 to rotate to the first position.

In addition, the central axis L3 of the third cylindrical surface 65 coincides with the central axis L of the pinion 72, so that a curvature radius of the third cylindrical surface 65 is large, and the third cylindrical surface 65 is gentle. Thus, when the connection member 6 escapes the limitation of the first elastic limiting member 81 or the second elastic limiting member 82, and moves along the movement track, the first elastic limiting member 81 or the second elastic limiting member 82 has a small deformation, so that the first elastic limiting member 81 or the second elastic limiting member 82 may be well prevented from being damaged due to a large deformation.

The first elastic limiting member 81 and the second elastic limiting member 82 may be rubber blocks or silica gel blocks, which are not limited herein.

Figure 5B:
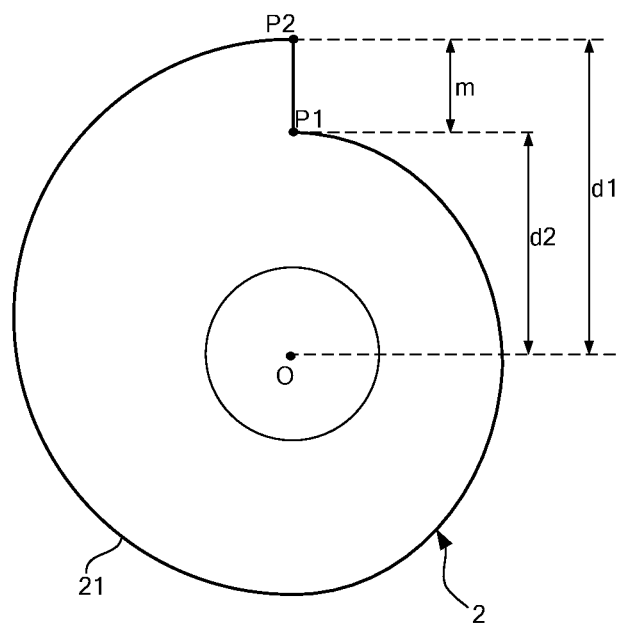
FIG. 5b is a schematic diagram of a contour shape of a reel, in accordance with some embodiments of the present disclosure.

In some embodiments, as shown in FIGS. 4, 5*a*, and 5*b*, in the cross-section of the reel 2, a distance d1 from a tail-end P2 of a contour line 21 of the reel 2 to a rotation center O of the reel 2 is greater than a distance d2 from a head-end P1 of the contour line 21 to the rotation center O of the reel 2. The first end of the display screen 3 is connected to the head-end P1 of the contour line 21, and the display screen 3 is configured to be wound on the reel 2 in a direction from the head-end P1 to the tail-end P2 of the contour line 21.

As shown in FIG. 4, when the display screen 3 is wound on the reel 2 for a second turn, the second turn of the display screen 3 is required to be overlapped on a first turn. If the reel 2 is designed to be circular, since the display screen 3 has a certain thickness, at a junction of the second turn and the first turn, the display screen 3 is required to be greatly deformed to be overlapped on the first turn, which easily causes a certain damage to the display screen 3. Therefore, the distance d1 from the tail-end P2 of the contour line 21 of the reel 2 to the rotation center O of the reel 2 is designed to be greater than the distance d2 from the head-end P1 of the contour line 21 to the rotation center O of the reel 2. Thus, as shown in FIG. 4, the display screen 3 may be smoothly overlapped on the first turn when being wound for the second turn, thereby avoiding a large deformation of the display screen 3 at the junction of the second turn and the first turn, which is beneficial to prolong the service life of the display screen 3.

In some embodiments, as shown in FIGS. 5a and 5b, the distance from the tail-end P2 of the contour line 21 to the rotation center O of the reel 2 is d1, the distance from the head-end P1 to the rotation center O of the reel 2 is d2, and the thickness of the display screen 3 is m, where d1 and d2 satisfy d1−d2=m. That is, d1 and d2 differ by the thickness of the display screen 3. By such an arrangement, as shown in FIG. 4, when the display screen 3 is wound for the second turn, the display screen 3 is able to be smoothly overlapped on the first turn, thereby avoiding the deformation of the display screen 3 at the junction of the second turn and the first turn, which is beneficial to prolong the service life of the display screen 3.

The shape of the contour line 21 of the reel 2 is not exclusive. In some embodiments, as shown in FIG. 5b, the contour line 21 of the reel 2 may be a curve. In a winding direction of the display screen 3 on the reel 2, a distance from the contour line 21 to the rotation center O of the reel 2 is gradually increased.

In some other embodiments, as shown in FIGS. 4 and 5a, the contour line 21 includes a plurality of linear segments 22 connected in sequence. In the winding direction of the display screen 3 on the reel 2, distances from the plurality of linear segments 22 to the rotation center O of the reel 2 are gradually increased. Since the support 32 has a certain width, when being wound on the reel 2, the display screen 3 is divided into a plurality of display screen segments by the supports 32. The contour line 21 is provided as the plurality of linear segments 22 that are connected in sequence, that is, the side surface of the reel 2 is composed of a plurality of planes that are connected in sequence, so that when the display screen 3 is wound on the reel 2, the side surface of the reel 2 may be in surface contact with the display screen segments, so as to increase a stability of the display screen 3 wound on the reel 2.

In the description of the above embodiments, the specific features, structures, materials or characteristics may be combined in any one or more embodiments or examples in any suitable manner.

The foregoing descriptions are merely specific implementation manners of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display device, comprising:
   a housing provided with an opening therein;
   a reel rotatably disposed in the housing;
   a display screen, a first end of the display screen being connected to the reel, the display screen including a flexible display panel and a plurality of supports arranged in a length direction of the flexible display panel, any two adjacent supports in the plurality of supports being a first support and a second support in sequence in the length direction, the first support including a connection portion and a first surface, the second support including a second surface, and the first surface and the second surface being configured to support the flexible display panel;
   connection members, a connection member in the connection members being disposed on the second support; and
   a driving apparatus, the driving apparatus being configured such that when the first surface and the second surface are coplanar, the driving apparatus drives the connection member to move relative to the second support between a first position and a second position, wherein when the connection member is at the first position, the connection member is connected to the connection portion, so that the second support and the first support are connected, and when the connection member is at the second position, the connection member is disconnected from the connection portion, so that the display screen is able to be wound on the reel.

2. The display device according to claim 1, wherein the driving apparatus includes:
   a rack fixedly disposed at the opening, an extending direction of the rack being parallel to the length direction of the flexible display panel; and
   pinions, a pinion in the pinions being rotatably disposed on the second support and fixedly connected to the connection member; the pinion being configured such that when the first surface and the second surface are coplanar, and the display screen extends out or retracts relative to the housing through the opening, the pinion is engaged with the rack to drive the connection member to rotate between the first position and the second position.

3. The display device according to claim 2, wherein
   in a width direction of the flexible display panel, an accommodation space is provided at an end of the second support;
   the second support further includes a third surface arranged opposite to the second surface, and the accommodation space is located between the third surface and the second surface, and penetrates through two ends of the second support in the length direction of the flexible display panel;
   the pinion and the connection member are disposed in the accommodation space, and the rack is configured such that the rack extends into the accommodation space to be engaged with the pinion.

4. The display device according to claim 3, wherein
   the connection portion is a clamping groove disposed in a side surface of the first support proximate to the second support;
   the accommodation space and the clamping groove are configured such that when the first surface and the second surface are coplanar, the clamping groove and the accommodation space are arranged opposite to each other, so that the connection member is able to cooperatively extend into the clamping groove from the accommodation space to make the connection member at the first position.

5. The display device according to claim 4, wherein the accommodation space includes:
   an accommodation groove disposed in a side surface of the second support proximate to the first support; and
   a limiting groove disposed in an end surface of the second support in the width direction of the flexible display panel, the limiting groove penetrating through the two ends of the second support in the length direction of the flexible display panel; wherein
   the accommodation groove has a communication port communicated with the limiting groove, the pinion is disposed at the communication port, the rack is configured such that the rack extends into the limiting groove to be engaged with the pinion, and at least one portion of the connection member is located in the accommodation groove;

the accommodation groove and the clamping groove are configured such that when the first surface and the second surface are coplanar, the clamping groove and the accommodation groove are arranged opposite to each other, so that the connection member is able to cooperatively extend into the clamping groove from the accommodation groove.

6. The display device according to claim 5, wherein the accommodation groove and the clamping groove are configured such that when the first surface and the second surface are coplanar, the accommodation groove and the clamping groove are matched to form a fan-shaped groove;

the fan-shaped groove includes a first groove wall on the first support, a second groove wall on the second support, and an arc-shaped groove wall connected between the first groove wall and the second groove wall; the communication port is disposed at a position closer to an apex of the fan-shaped groove than the arc-shaped groove wall;

the connection member is configured such that when at the first position, the connection member abuts against the first groove wall, and when at the second position, the connection member is located in the accommodation groove, and abuts against the second groove wall.

7. The display device according to claim 4, further comprising:

first elastic limiting members, at least one portion of a first elastic limiting member in the first elastic limiting members being located in the clamping groove, and the first elastic limiting member being configured such that when the connection member is at the first position, the first elastic limiting member abuts against the connection member to prevent the connection member from rotating to the second position, and when the connection member rotates between the first position and the second position, the first elastic limiting member is deformed under an extrusion of the connection member to avoid a movement track of the connection member; and second elastic limiting members, at least one portion of a second elastic limiting member in the second elastic limiting members being located in the accommodation space, and the second elastic limiting member being configured such that when the connection member is at the second position, the second elastic limiting member abuts against the connection member to prevent the connection member from rotating to the first position, and when the connection member rotates between the first position and the second position, the second elastic limiting member is deformed under the extrusion of the connection member to avoid the movement track of the connection member.

8. The display device according to claim 7, wherein the connection member is rod-shaped, an end of the connection member is fixedly connected to the pinion, and another end of the connection member is an abutting portion;

the first elastic limiting member is configured such that when the connection member is at the first position, the first elastic limiting member abuts against the abutting portion to prevent the connection member from rotating to the second position;

the second elastic limiting member is configured such that when the connection member is at the second position, the second elastic limiting member abuts against the abutting portion to prevent the connection member from rotating to the first position.

9. The display device according to claim 8, wherein the abutting portion includes:

a first cylindrical surface, a generatrix of the first cylindrical surface being perpendicular to a central axis of the pinion; and two first rounded surfaces respectively located at two end edges of the first cylindrical surface in a rotation direction of the connection member;

the first elastic limiting member is configured such that when the connection member is at the first position, the first elastic limiting member abuts against a first rounded surface in the two first rounded surfaces proximate to the second support;

the second elastic limiting member is configured such that when the connection member is at the second position, the second elastic limiting member abuts against another first rounded surface in the two first rounded surfaces proximate to the first support.

10. The display device according to claim 8, wherein the abutting portion includes a second cylindrical surface, a generatrix of the second cylindrical surface being parallel to a central axis of the pinion;

the first elastic limiting member is configured such that when the connection member is at the first position, the first elastic limiting member abuts against a side of the second cylindrical surface proximate to the second support; and the second elastic limiting member is configured such that when the connection member is at the second position, the second elastic limiting member abuts against a side of the second cylindrical surface proximate to the first support.

11. The display device according to claim 8, wherein the abutting portion includes:

a third cylindrical surface, a central axis of the third cylindrical surface coinciding with a central axis of the pinion; and two second rounded surfaces respectively located at two end edges of the third cylindrical surface in a rotation direction of the connection member;

the first elastic limiting member is configured such that when the connection member is at the first position, the first elastic limiting member abuts against a second rounded surface in the two second rounded surfaces proximate to the second support; and the second elastic limiting member is configured such that when the connection member is at the second position, the second elastic limiting member abuts against another second rounded surface in the two second rounded surfaces proximate to the first support.

12. The display device according to claim 8, wherein the first elastic limiting member includes a first circular arc surface configured to abut against the abutting portion; and the second elastic limiting member includes a second circular arc surface configured to abut against the abutting portion.

13. The display device according to claim 1, wherein in a cross-section of the reel, a distance from a tail-end of a contour line of the reel to a rotation center of the reel is greater than a distance from a head-end of the contour line to the rotation center of the reel;

the first end of the display screen is connected to the head-end of the contour line, and the display screen is configured to be wound on the reel in a direction from the head-end to the tail-end of the contour line.

14. The display device according to claim 13, wherein the contour line includes a plurality of linear segments connected in sequence, and in a winding direction of the display screen on the reel, distances from the plurality of linear segments to the rotation center of the reel are gradually increased.

15. The display device according to claim 13, wherein the distance from the tail-end of the contour line to the rotation center of the reel is d1, the distance from the head-end to the rotation center of the reel is d2, and a thickness of the display screen is m;

where d1 and d2 satisfy d1−d2=m.

16. The display device according to claim 1, further comprising a driving spring, the driving spring being spirally arranged around the reel, an end of the driving spring being connected to the reel, and another end of the driving spring being connected to the housing;

the driving spring being configured such that when the reel rotates in a first rotation direction, the driving spring is wound up to apply a reset force to the reel that is able to drive the reel to rotate in a second rotation direction;

wherein the first rotation direction is a rotation direction of the reel when the display screen extends out of the housing through the opening, and the second rotation direction is an opposite direction to the first rotation direction.

17. The display device according to claim 16, further comprising:

a ratchet fixedly sleeved on the reel and including a plurality of ratchet teeth, each ratchet tooth including a tooth back surface and a stop surface arranged in sequence in the second rotation direction, and a distance from an end of the tooth back surface proximate to the stop surface to a center of the ratchet being greater than a distance from an end of the tooth back surface away from the stop surface to the center of the ratchet;

an operating shaft rotatably disposed on the housing, a portion of the operating shaft extending out of the housing; and a pawl fixed on the operating shaft and extending into a tooth groove between two adjacent ratchet teeth.

18. The display device according to claim 1, wherein the second support includes a third rounded surface disposed on a side of the second surface proximate to the first support;

the first support includes a fourth rounded surface disposed on a side of the first surface proximate to the second support.

19. The display device according to claim 1, further comprising a limiting member with a mounting groove, the mounting groove being matched with a second end of the display screen to fix the limiting member on the display screen; wherein in a thickness direction of a portion of the display screen extending out the housing, a dimension of the limiting member is greater than a dimension of the opening.

* * * * *